(12) United States Patent
Ma et al.

(10) Patent No.: US 11,309,364 B2
(45) Date of Patent: Apr. 19, 2022

(54) SENSOR, DISPLAY PANEL AND ELECTRONIC DEVICE

(71) Applicant: Hubei Yangtze Industrial Innovation Center Of Advanced Display Co., Ltd., Wuhan (CN)

(72) Inventors: Shaolong Ma, Shanghai (CN); Feng Lu, Shanghai (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 17/154,946

(22) Filed: Jan. 21, 2021

(65) Prior Publication Data

US 2021/0143232 A1 May 13, 2021

(30) Foreign Application Priority Data

Oct. 27, 2020 (CN) .......................... 202011164137.2

(51) Int. Cl.
*H01L 27/32* (2006.01)
*H01L 51/00* (2006.01)
*H01L 51/52* (2006.01)
*G01L 1/22* (2006.01)

(52) U.S. Cl.
CPC ........ *H01L 27/3225* (2013.01); *G01L 1/2206* (2013.01); *H01L 27/3272* (2013.01); *H01L 27/3276* (2013.01); *H01L 51/0097* (2013.01); *H01L 51/5253* (2013.01)

(58) Field of Classification Search
CPC ............. H01L 27/3225; H01L 27/3272; H01L 27/3276; H01L 51/0097; H01L 51/5253; B81B 2201/0264; G06F 3/041
See application file for complete search history.

(56) References Cited

U.S. PATENT DOCUMENTS

| | | | |
|---|---|---|---|
| 10,545,598 B2 * | 1/2020 | Yang | H01L 27/1255 |
| 10,642,402 B2 * | 5/2020 | Zhao | H01L 51/5234 |
| 10,860,159 B2 * | 12/2020 | Leng | G02F 1/13338 |
| 11,132,085 B2 * | 9/2021 | Yang | H01L 27/3225 |
| 2013/0265256 A1 * | 10/2013 | Nathan | G06F 3/04144 345/173 |
| 2018/0046300 A1 * | 2/2018 | Dun | G02F 1/1343 |
| 2018/0129332 A1 * | 5/2018 | Leng | H01L 27/1222 |
| 2018/0182901 A1 * | 6/2018 | Lim | H01L 29/517 |

* cited by examiner

*Primary Examiner* — Sardis F Azongha
(74) *Attorney, Agent, or Firm* — Kilpatrick Townsend & Stockton LLP

(57) ABSTRACT

Provided are a sensor, a display panel and an electronic device. The sensor includes a flexible substrate, a plurality of sensing units disposed on a first side of the flexible substrate, and at least one inorganic blocky structure and at least one organic layer which are disposed on the first side of the flexible substrate, where each of the plurality of sensing units is disposed corresponding to a respective one of the at least one blocky structure, and a vertical projection of at least part of the respective one of the at least one blocky structure on a plane where the flexible substrate is located overlaps with the corresponding one of the plurality of sensing units, and where the at least one organic layer is filled adjacent blocky structures.

22 Claims, 15 Drawing Sheets

SENSOR, DISPLAY PANEL AND ELECTRONIC DEVICE

CROSS-REFERENCE TO RELATED APPLICATION

This application claims priority to Chinese Patent Application No. 202011164137.2 filed Oct. 27, 2020, the disclosure of which is incorporated herein by reference in its entirety.

FIELD

The present disclosure relates to the field of semiconductors and, in particular, to a sensor, a display panel and an electronic device.

BACKGROUND

A strain sensor is a kind of sensor based on measuring the strain produced by the deformation of an object caused by force. Metal strain devices and semiconductor material strain devices are sensing elements commonly used for the strain sensor. The strain sensor is a sensing element that can convert a change of the strain on a mechanical component into a change of the resistance.

Generally, the strain sensor mainly includes a sensor pressure head and a flexible film provided with a strain sensor unit. External contact causes the sensor pressure head to apply force to the flexible film, and thus the flexible film produces the strain, and the strain of the flexible film causes the strain sensor unit to respond.

However, a flexible electronic device such as the above strain sensor is easy to lose efficacy due to external force, so the reliability of the flexible electronic device is very poor.

SUMMARY

The present disclosure provides a sensor, a display panel and an electronic device to solve the issue that the existing flexible strain sensor is easily broken.

In a first aspect, an embodiment of the present disclosure provides a sensor. The sensor includes a flexible substrate, a plurality of sensing units disposed on a first side of the flexible substrate and at least one inorganic blocky structure and at least one organic layer which are disposed on the first side of the flexible substrate.

Each of the plurality of sensing units is disposed corresponding to a respective one of the at least one blocky structure, and a vertical projection of at least part of the respective one of the at least one blocky structure on a plane where the flexible substrate is located overlaps with the corresponding one of the plurality of sensing units.

The at least one organic layer is filled adjacent blocky structures.

In a second aspect, an embodiment of the present disclosure further provides a display panel. The display panel includes the sensor provided by any one of the embodiments of the present disclosure.

In a third aspect, an embodiment of the present disclosure further provides an electronic device. The electronic device includes the sensor provided by any one of the embodiments of the present disclosure, or includes the display panel provided by any one of the embodiments of the present disclosure.

In the present disclosure, the plurality of discrete sensing units are disposed on the flexible substrate of the sensor for pressure detection, and at least one organic layer and at least one discrete inorganic blocky structure are further disposed on the flexible substrate. That is, although a plurality of layers of inorganic materials are disposed on the flexible substrate, at least one layer of inorganic material is of the discrete structure, so that the issue that the entire layer of inorganic material is easily broken due to force is effectively avoided. At least one organic layer is also filled discrete inorganic blocky structures, so that the stress of each discrete inorganic blocky structure in the case of a large deformation is effectively released, and the entire sensor is protected. In addition, each sensing unit is disposed corresponding to a respective blocky structure, and a vertical projection of the respective blocky structure on the plane where the flexible substrate is located overlaps with the corresponding sensing unit. Then, when the flexible substrate of the sensor produces a micro deformation due to force, the respective blocky structure can support the corresponding sensing unit, further preventing the sensing unit from being broken or damaged, improving the reliability of the strain sensor, and effectively extending the life of the sensor.

DETAILED DESCRIPTION

Figure 1:
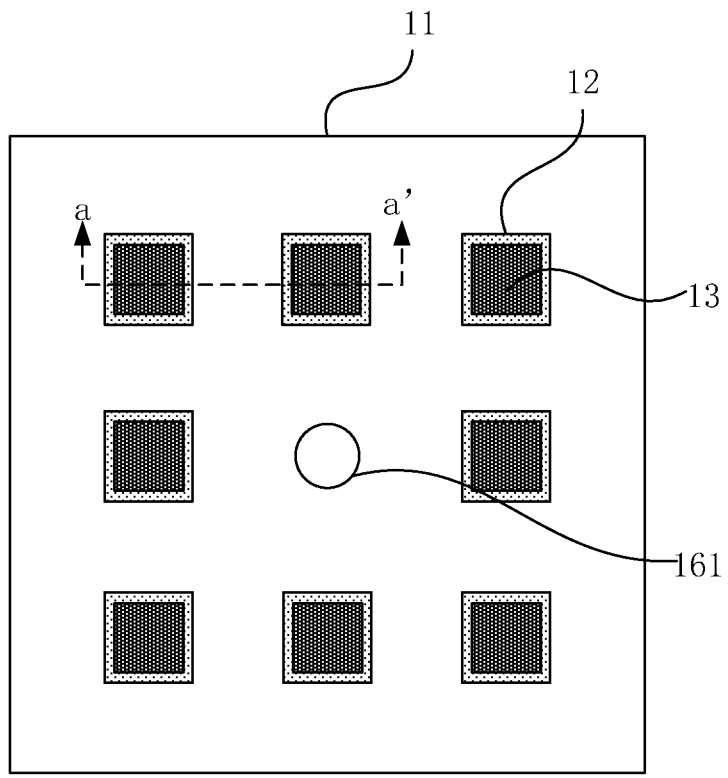
FIG. 1 is a plan structural view of a sensor according to an embodiment of the present disclosure.

The present disclosure is further described below in detail in conjunction with the drawings and embodiments. It is to be understood that the embodiments described herein are merely intended to explain and not intended to limit the present disclosure. In addition, it should be noted that for easy of description, only the part, but not all, of the structures related to the present disclosure is illustrated in the drawings.

Generally, flexible electronic devices, such as the strain sensor described in Background, can deform due to the external force and measure the deformation amount. In the process of implementing the present disclosure, a strain sensor with multiple inorganic layers is adopted for being disposed on a flexible substrate. Then, it is found that the stacked multiple inorganic layers are easily broken in the case of a large deformation, resulting in that the flexible electronic device loses efficacy. An embodiment of the present disclosure provides a sensor. The sensor includes a flexible substrate, multiple sensing units disposed on a first side of the flexible substrate and at least one inorganic blocky structure and at least one organic layer which are disposed on the first side of the flexible substrate.

Each sensing unit is disposed corresponding to a respective blocky structure, and a vertical projection of at least part of the respective blocky structure on a plane where the flexible substrate is located overlaps with the corresponding sensing unit.

The at least one organic layer is filled adjacent blocky structures.

In the embodiment of the present disclosure, multiple discrete sensing units are disposed on the flexible substrate of the sensor for pressure detection, and at least one organic layer and at least one inorganic blocky structure are further disposed on the flexible substrate. That is, although multiple layers of inorganic materials are disposed on the flexible substrate, at least one layer of inorganic material is of the discrete structure, so that the issue that the entire layer of inorganic material is easily broken due to force is effectively avoided. At least one organic layer is also filled adjacent discrete inorganic blocky structures, so that the stress of each discrete inorganic blocky structure in the case of the large deformation is effectively released, and the entire sensor is protected. In addition, each sensing unit is disposed corresponding to a respective blocky structure, and a vertical projection of the respective blocky structure on the plane where the flexible substrate is located overlaps with the corresponding sensing unit. Then, when the flexible substrate of the sensor produce a micro deformation due to force, the respective blocky structure can support the corresponding sensing unit, further preventing the sensing unit from being broken or damaged, improving the reliability of the strain sensor, and effectively extending the life of the sensor.

Figure 2:
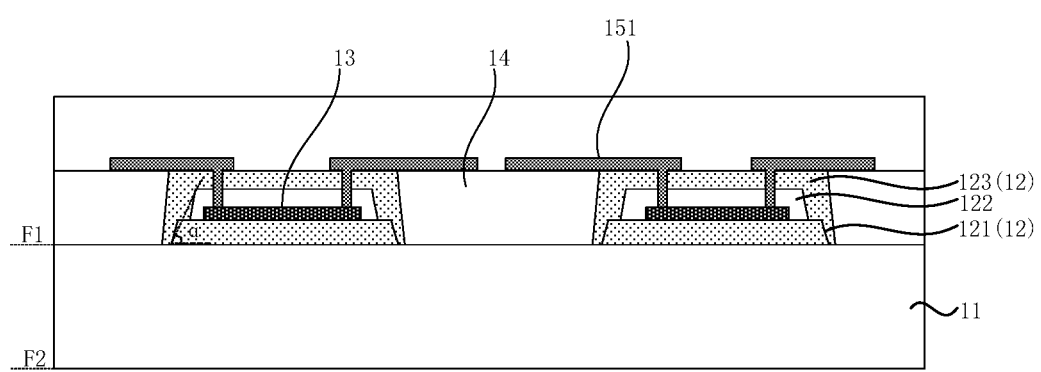
FIG. 2 is a sectional view of the sensor in FIG. 1 taken along a straight line a-a'.
Figure 3:
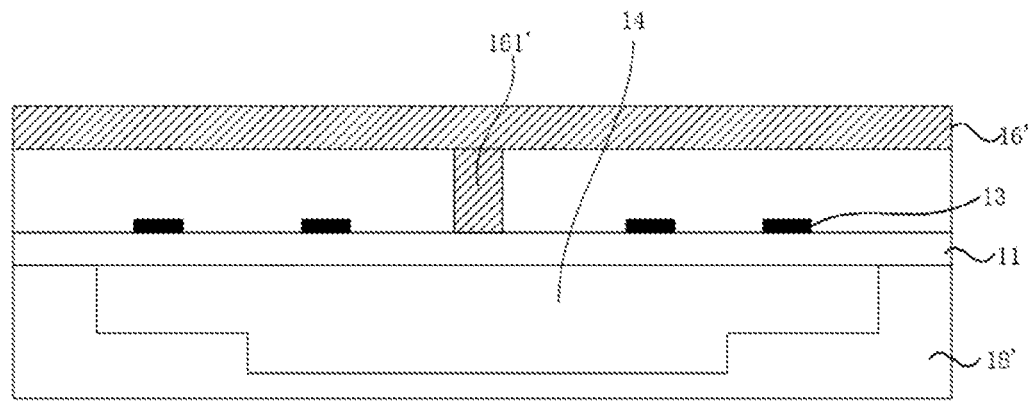
FIG. 3 is a sectional structural view of a sensor according to an embodiment of the present disclosure.

FIG. 1 is a plan structural view of a sensor according to an embodiment of the present disclosure, FIG. 2 is a sectional view of the sensor of FIG. 1 taken along a straight line a-a', and FIG. 3 is a sectional structural view of a sensor according to an embodiment of the present disclosure.

Referring to FIG. 1 and FIG. 3, the sensor may include a sensor base 18', a flexible substrate 11, a bearing base plate 16', and a sensor pressure head 161' on the bearing base plate 16'. Multiple sensing units 13 are distributed on the flexible substrate 11. When the external pressing on the bearing base plate 16' causes the sensor pressure head 161' to apply force to the flexible substrate 11, the flexible film 11 produces a strain, the sensing units 13 respond, and finally the force application position is determined according to the response intensities of different sensing units 13. Referring to FIG. 1 and FIG. 2, the flexible substrate 11 may include a plane of a first side F1 and a plane of a second side F2 disposed opposite to each other. The material of the flexible substrate 11 may include, for example, polyimide, polyethylene terephthalate or polyethylene naphthalate, to ensure that the flexible substrate 11 has good flexibility. Of course, the material of the flexible substrate 11 are not limited to the above, and other materials suitable for bending deformation and for being the flexible substrate of the sensor may also be selected.

Figure 4:
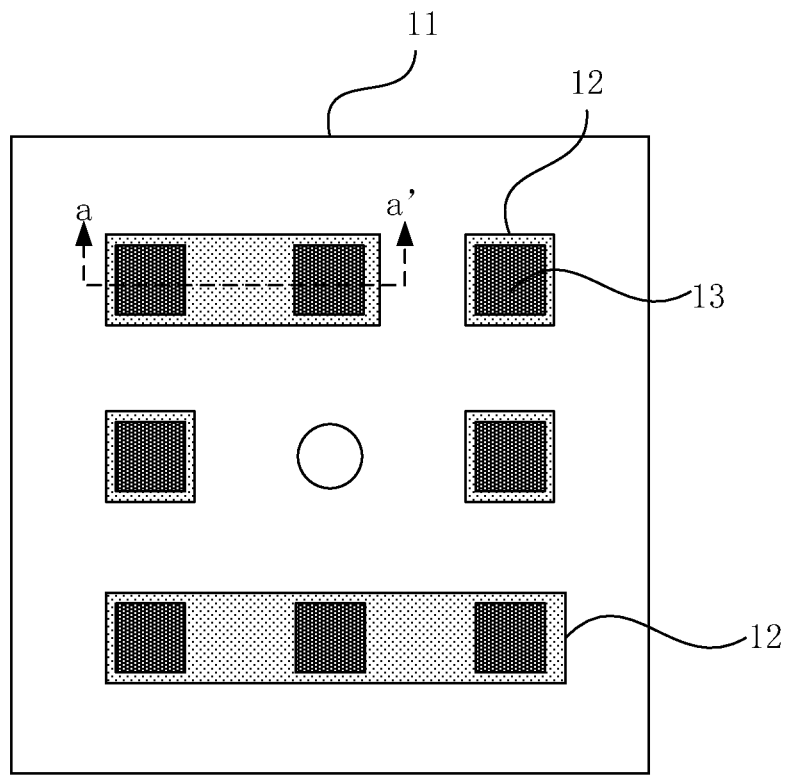
FIG. 4 is a plan structural view of another sensor according to an embodiment of the present disclosure.

The sensing units 13 are disposed on the first side F1 of the flexible substrate 11, and meanwhile, at least one inorganic blocky structure 12 and at least one organic layer 14 are also disposed on the first side F1 of the flexible substrate 11. That is, the blocky structure 12, the organic layer 14 and the sensing unit 13 are all disposed on the same side of the flexible substrate 11. The inorganic materials provided by the embodiment of the present disclosure may include discrete blocky structures 12, so that when the flexible substrate 11 of the sensor is subjected to the stress to deform, the stress on the inorganic materials can be effectively dispersed. The stress on each blocky structure 12 can be greatly reduced compared with the stress on an entire layer of the inorganic material, the brokenness can be avoided, and the reliability of the sensor can be improved. As shown in FIG. 1, each sensing unit 13 is disposed corresponding to a respective blocky structure 12, and thus a vertical projection of the blocky structure 12 on a plane where the flexible substrate 11 is located overlaps with the corresponding sensing unit 13, so that the blocky structure 12 provides certain support for the corresponding sensing unit 13 to protect the sensing unit. FIG. 1 shows the case where each blocky structure 12 corresponds to one sensing unit 13. Each blocky structure 12 uniformly forms an "isolated island" structure for dispensing the bending stress to protect the sensor. In addition, FIG. 4 is a plan structural view of another sensor according to an embodiment of the present disclosure. As shown in FIG. 4, each blocky structure 12 may correspond to two sensing units 13 or three sensing units 13, and separate blocky structures 12 form the "isolated island" structures with different sizes, so that the bending stress can also be dispersed to avoid the brokenness of the inorganic film layer.

On a plane parallel to the plane where the flexible substrate 11 is located, gaps are formed between separately discrete blocky structures 12. Referring to FIG. 2, at least one organic layer 14 is disposed between separate blocky structures 12. While effectively filling the gaps to keep the film layers of the sensor flat, the at least one organic layer 14 can be subject to the stress dispersed by the flexible substrate 11 and the blocky structures 12, so that the strength of the entire sensor can be improved, and the life of the sensor can be prolonged. In addition, lines 15 may be provided on the blocky structures 12. The lines 15 are connected to the sensing units 13 for inputting bias voltages to the sensing units 13 to drive the sensing units 13 to perform strain detection. The lines 15 may further be configured to receive strain voltages output by the sensing units 13, facilitating the subsequent calculation of the strain amount.

In an embodiment, with continued reference to FIG. 2, the sensor may include at least one inorganic layer; each inorganic layer includes multiple blocky structures 12; and the blocky structures 12 are disposed in one-to-one correspondence with the sensing units 13.

In some embodiments, blocky structures 12 on the same inorganic layer are disposed in one-to-one correspondence with the sensing units 13, and vertical projections of blocky structures 12 on different inorganic layers may overlap, that is, blocky structures 12 on different inorganic layers may correspond to one sensing unit 13.

In some embodiments, blocky structures 12 on each inorganic layer are disposed in one-to-one correspondence with the sensing units 13.

The sensor in the embodiment generally includes at least one organic layer and at least one inorganic layer, and the organic layer, the inorganic layer, and a metal layer or a semiconductor layer are stacked on each other to form the sensing units. It should be noted that the sensor includes at least one inorganic layer, and the at least one inorganic layer in the embodiment forms the blocky structures 12 to disperse the bending stress. In an embodiment, the sensor in the embodiment may include at least one inorganic layer, and each inorganic layer includes at least one blocky structure 12. Exemplary, as shown in FIG. 2, FIG. 2 shows three inorganic layers, and each inorganic layer is provided with the blocky structures 12. Along a direction perpendicular to the flexible substrate 11, multiple blocky structures 12 are stacked, to further disperse the bending stress. In addition, as shown in FIG. 2, the blocky structures 12 of each inorganic layer in the embodiment are disposed in one-to-one correspondence with the sensing units 13, the vertical projections of the blocky structures 12 on the plane where the flexible substrate 11 is located overlap with the corresponding sensing unit 13. Since the number of the independent blocky structures 12 divided from each inorganic layer is relatively large, the stress on each blocky structure 12 is extremely small. Thus, the sensing units 13 can be further prevented from being broken, and the reliability of the device is improved. As shown in FIG. 2, the strength of the blocky structures 12 made of the inorganic material is high, so that the blocky structures 12 can be in direct contact with the corresponding sensing unit 13 and can provide certain support and protection for the corresponding sensing unit 13, and it is avoided that the sensing unit 13 lose efficacy when the flexible substrate 11 deforms. In an embodiment, the blocky structures 12 need to be disposed on the side of the sensing units 13 close to the flexible substrate 11 to separate the flexible substrate 11 and the sensing units 13 to a certain extent, to further prevent that the sensing units 13 lose efficacy. Further, as shown in FIG. 2, each inorganic layer in the embodiment is provided with the blocky structures 12 only at the position where the sensing units 13 are located, that is, each blocky structure 12 corresponds to one sensing unit 13, so that the vertical projection of each blocky structure 12 can exactly overlap with the corresponding sensing unit 13. Therefore, the sensing units 13 can be protected and supported, the area set for the blocky structures in each inorganic layer can be effectively reduced, and the bending stress of the flexible substrate 11 can be reduced.

In an embodiment, with continued reference to FIG. 2, the sensor may include a first blocky structure 121, a second organic structure 122 and a third blocky structure 123 which are sequentially stacked along a direction away from the flexible substrate 11. The first blocky structure 121 is disposed on the side of the sensing units 13 close to the flexible substrate 11, and the area of the first blocky structure 121 is larger than the area of the sensing unit 13. The area of the second organic structure 122 is smaller than the area of the first blocky structure 121. The third blocky structure 123 is disposed on the side of the sensing units 12 away from the flexible substrate 11, and the area of the third blocky structure 123 is larger than the area of the first blocky structure 121.

If the flexible substrate 11 is provided with multiple inorganic layers and multiple organic layers, and each inorganic layer is provided with the blocky structures 12, the organic layer may be set as organic structures corresponding to the blocky structures 12. Thus, along the direction perpendicular to the flexible substrate 11, multiple blocky structures 12 and multiple organic structures are stacked. While further dispersing the bending stress, the stacked structures effectively support the sensing units 13, and the organic structures isolate the sensing units 13 from water and oxygen in the environment to effectively prevent water and oxygen from penetrating the sensing units 13. For example, the sensor may include the first blocky structure 121, the second organic structure 122 and the third blocky structure 123 which are sequentially stacked along the direction away from the flexible substrate 11. The first blocky structure 121 is disposed on the side of the sensing unit 13 close to the flexible substrate 11, and the area of the first blocky structure 121 is larger than the area of the sensing unit 13, so that the first blocky structure 121 supports the entire sensing unit 13. The area of the second organic structure 122 may be smaller than the area of the first blocky structure 121, and thus the edges of the first blocky structure 121 and the edges of the second organic structure 122 are not aligned, and segment gaps exit. Therefore, the edges of the first blocky structure 121 and the edges of the second organic structure 122 are disposed in a staggered mode, and thus the side surfaces of the edges of the first blocky structure 121 and the side surfaces of the edges of the second organic structure 122 form a slope angle α instead of a right angle. In the case where the side surfaces of the film layers form a right angle, the edges of the film layers are easily broken. The forming of the above slope angle α can prevent the brokenness of the edges of the inorganic film layers caused by the excessively large slope angle α during the manufacturing process of the sensor. In an embodiment, the second organic structure 122 may be disposed on the side of the sensing unit 13 close to the flexible substrate 11, or may be disposed on the side of the sensing unit 13 away from the flexible substrate 11. The disposition sequence of the second organic structure 122 and the sensing unit 13 is not limited in the embodiment. As shown in FIG. 2, the second organic structure 122 may be disposed on the side of the sensing unit 13 away from the flexible substrate 11, so that the first blocky structure 121 and the second organic structure 122 wrap the sensing unit 13 to prevent water and oxygen from penetrating the sensing unit 13 besides supporting the sensing unit 13. Finally, the third blocky structure 123 is disposed on the side of the sensing unit 13 away from the flexible substrate 11, and the area of the third blocky structure 123 is larger than the area of the first blocky structure 121 and the second organic structure 122, so that the third blocky structure 123 can wrap the first blocky structure 121 and the second organic structure 122 and protect the first blocky structure 121 and the second organic structure 122 Thus, the sensing unit 13 between the first blocky structure 121 and the third blocky structure 123 can be protected. In addition, the third blocky structure 123 wraps the position where the first blocky structure 121 is in contact with the second organic structure 122 to further prevent water and oxygen from penetrating the sensing unit 13, to protect the sensing unit 13 and enhance the strength of the first blocky structure 121 and the strength of the second organic structure 122. Therefore, the support of the first blocky structure 121 and the second organic structure 122 on the sensing unit 13 is enhanced.

Figure 5:
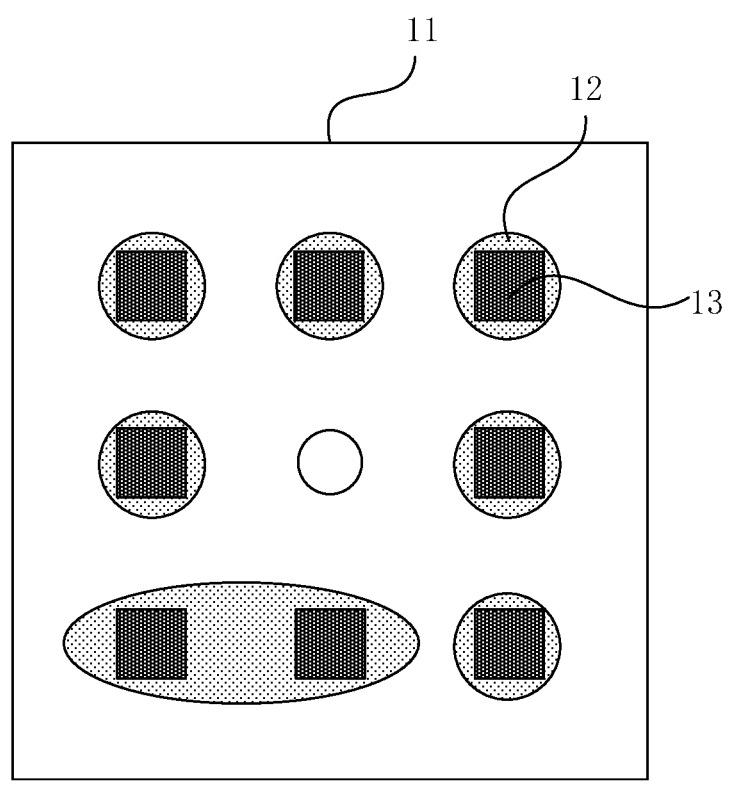
FIG. 5 is a plan structural view of another sensor according to an embodiment of the present disclosure.
Figure 6:
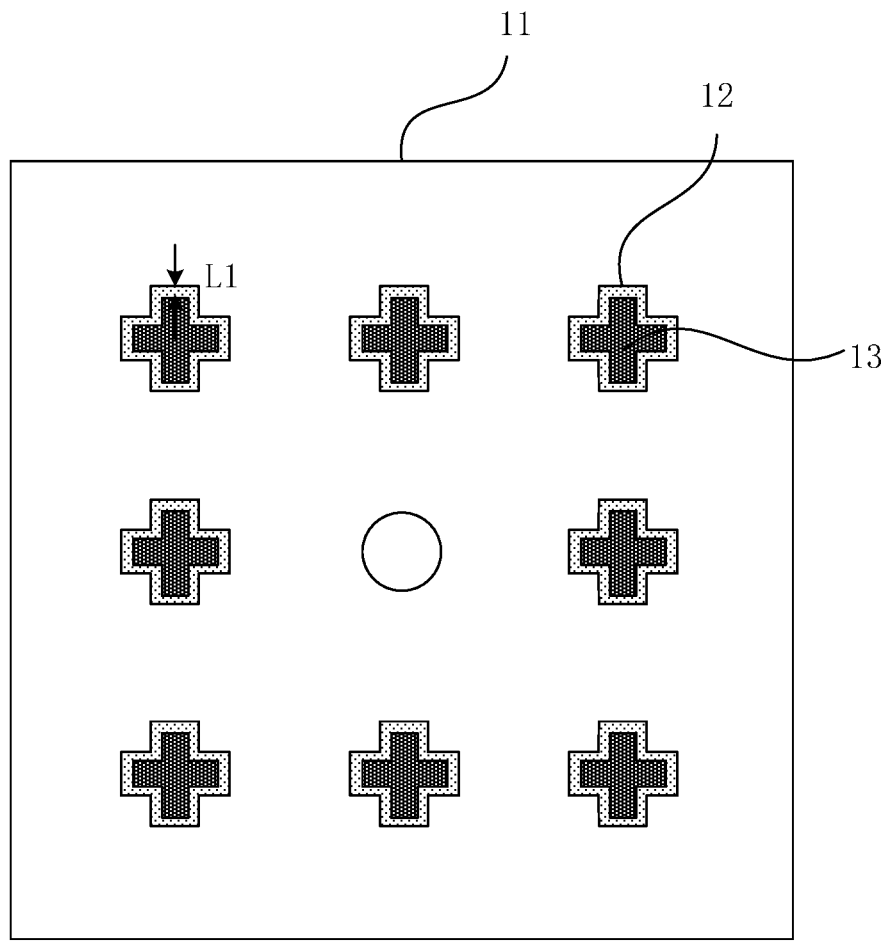
FIG. 6 is a plan structural view of another sensor according to an embodiment of the present disclosure.

FIG. 5 is a plan structural view of another sensor according to an embodiment of the present disclosure. In an embodiment, shapes formed by vertical projections of the blocky structures 12 on the plane where the flexible substrate 11 is located include rectangle, circle, ellipse and other irregular shapes. Exemplary, as shown in FIGS. 1 and 4, the vertical projections of the blocky structures 12 on the plane where the flexible substrate 11 is located may be rectangles. In addition, the vertical projections of the blocky structures 12 on the plane where the flexible substrate 11 is located may also be circles and ellipses shown in FIG. 5. Furthermore, the vertical projections of the blocky structures 12 on the flexible substrate 11 may further be of other regular or irregular shapes overlapping with the sensing units 13. The specific shape of the blocky structures 12 is not limited in the embodiment. In an embodiment, the vertical projections of the blocky structures 12 on the plane where the flexible substrate 11 is located may be determined according to the shape of the sensing units 13. For example, FIG. 6 is a plan structural view of another sensor according to an embodiment of the present disclosure. As shown in FIG. 6, in addition to the rectangles shown in FIG. 5, the sensing units 13 may be of other regular or irregular shapes. The sensing unit 13 showed in FIG. 6 is cross-shaped, so that the vertical projection of the blocky structure 12 on the flexible substrate 11 may also be of the cross-shaped structure with the size slightly larger than the size of the sensing unit 13. Exemplary, in the plane where the flexible substrate 11 is located, the distance L1 between the edge of the blocky structure 12 and the edge of the sensing unit 13 is several microns, so that the size of the blocky structure 12 is approximately the same as the size of the sensing unit 13. Thus, the size of the blocky structure 12 is further reduced, and the film layers of the sensor are prevented from being broken.

Figure 7:
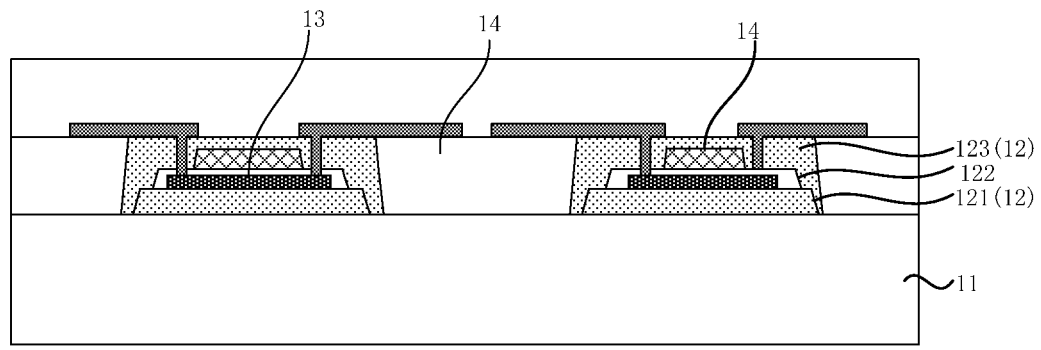
FIG. 7 is another sectional view of the sensor in FIG. 1 taken along the straight line A-A'.

FIG. 7 is another sectional view of the sensor in FIG. 1 taken along a straight line a-a'. In an embodiment, at least one organic layer 14 is disposed between two adjacent layers of blocky structures 12. The at least one organic layer 14 disposed between the two adjacent layers of blocky structures 12 can effectively disperse the stress between two layers of blocky structures 12, so that the two adjacent layers of blocky structures 12 are prevented from pressing against each other to cause fractures, and the propagation of the cracks between adjacent layers of blocky structures 12 can also be prevented. In addition, the design of the inorganic materials and the organic materials stacked on each other can effectively prevent peeling of the film layers and improve the performance of the sensor device.

In an embodiment, with continued reference to FIG. 7, the organic layer 14 disposed between two adjacent layers of blocky structures 12 may be encapsulated by the adjacent blocky structures 12 disposed on two sides of the organic layer 14, so that along the direction perpendicular to the flexible substrate 11, the segment gaps exist between the edges of the film layers, the film layers are disposed in a staggered mode, which is conducive to the layout of the film layers, preventing the brokenness of the edges of the film layers caused by the steep slope between the edges of the film layers. Meanwhile, the design of the inorganic materials and the organic materials stacked on each other can effectively prevent water and oxygen from penetrating the sensing unit 12, to protect the sensing unit 13 and prolong the life of the entire sensor.

Figure 8:
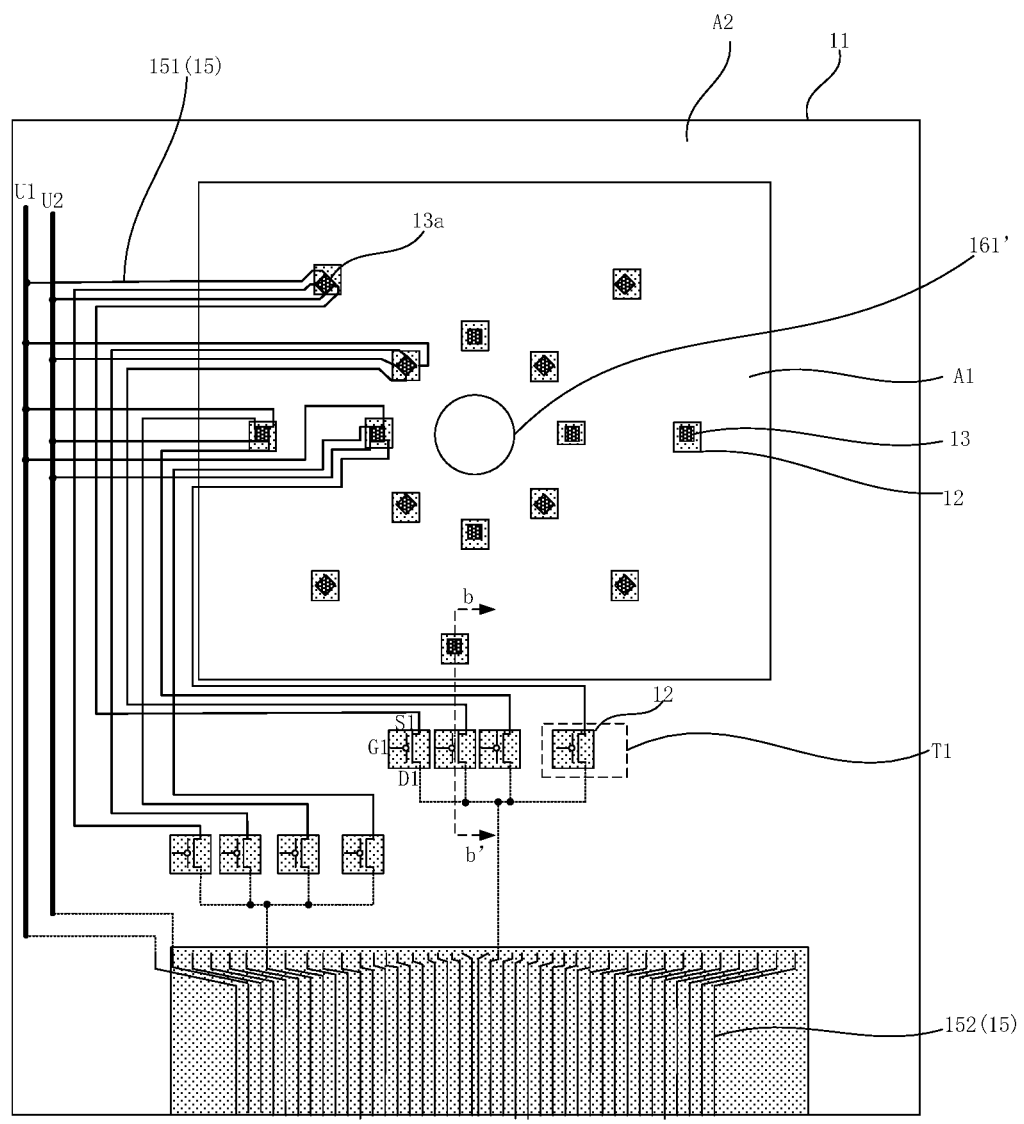
FIG. 8 is a plan structural view of another sensor according to an embodiment of the present disclosure.

FIG. 8 is a plan structural view of another sensor according to an embodiment of the present disclosure. In an embodiment, the sensor may further include multiple lines 15 and multiple control units T1 electrically connected to multiple sensing units 13. The sensor includes a sensing region A1 and a peripheral region A2 surrounding the sensing region A1. The sensing region A1 is provided with the sensing units 13, and the peripheral region A2 is provided with the control units T1. The vertical projections of the blocky structures 12 on the plane where the flexible substrate 11 is located overlap with the control units T1; and/or the vertical projections of the blocky structures 12 overlap with the lines 15.

In the embodiment, the sensor may include the sensing region A1 and the peripheral region A2 surrounding the sensing region A1, and the sensing units 13 are disposed in the sensing region A1. As shown in FIG. 1, the sensing units 13 may be evenly arranged in a regular array around the center of the sensing region A1, or may be arranged irregularly as shown in FIG. 8. Exemplary, the center position of the sensing region A1 may be configured to dispose the sensor pressure head 161', and the sensing units 13 may be disposed irregularly around the sensor pressure head 161'. The shape of the arrangement of the sensing units 13 on the flexible substrate 11 is not limited in the embodiment. In addition, the peripheral region A2 of the sensor may further be provided with the control units T1. The control units T1 are electrically connected to the sensing units 13 for inputting the bias voltages to the sensing units 13 to drive the sensing units 13 to perform strain detection. The control units T1 may further be configured to receive the strain voltages output by the sensing units 13, facilitating the subsequent calculation of the strain amount. In the embodiment, the blocky structures 12 corresponding to the control units T1 are further provided. The vertical projections of the blocky structures 12 on the plane where the flexible substrate 11 is located overlap with the control units T1, so that when the sensor deforms due to force, the blocky structures 12 may also support the control units T1 to prevent the control units T1 from being broken, protecting the control circuit of the sensor and improving the reliability of the entire sensor device. In addition, the sensor may further include multiple lines 15, which may establish the connection between the sensing units 13 and the corresponding control units T1. In the embodiment, to prevent the lines 15 from being broken during the bending process of the flexible substrate 11, the vertical projections of a part of blocky structures 12 on the plane where the flexible substrate 11 is located may overlap with the lines 15 to provide strength support for the lines 15.

Figure 9:
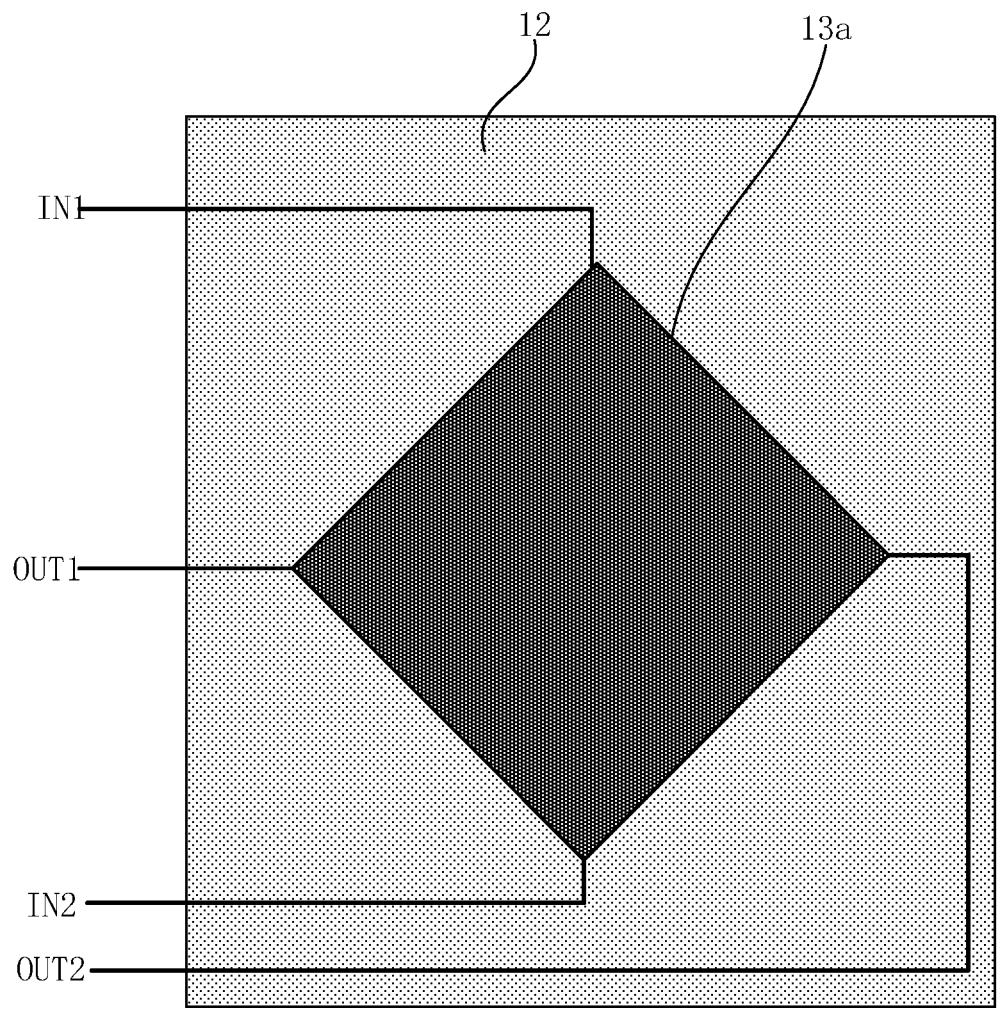
FIG. 9 is an enlarged structural view of one sensing unit in FIG. 8.

FIG. 9 is an enlarged structural view of one sensing unit in FIG. 8. Specifically, FIG. 9 illustrates an enlarged view of the structure of the sensing unit 13a in FIG. 8. Referring to FIG. 8 and FIG. 9, In an embodiment, the sensor may further include multiple lines 15, and the lines 15 include multiple first lines 151 and multiple second lines 152. The control units T1 are connected to the sensing units 13 through the first lines 151, and the second lines 152 are disposed in the peripheral region A2. Each sensing unit 13 includes a sensing strain gauge, and the edges of the sensing strain gauge are sequentially provided with four connecting terminals: a first bias voltage input terminal IN1, a first strain voltage output terminal OUT1, a second bias voltage input terminal IN2 and a second strain voltage output terminal OUT2. The first lines 151 are connected in one-to-one correspondence to the connecting terminals. The first bias voltage input terminal IN1 of each sensing unit 13 is connected to a first level output terminal U1 through a respective first line 151. The second bias voltage input terminal IN2 of each sensing unit 13 is connected to a second level output terminal U2 through a respective first line 151. Each control unit T1 includes an active layer (not shown in FIG. 8), a gate electrode G1 and source and drain electrodes. The source electrode S1 of each of a part of the control units T1 is connected to the first strain voltage output terminal OUT1 of the corresponding sensing unit 13 through a respective first line 151. The source electrode S1 of each of the other part of the control units T1 is connected to the second strain voltage output terminal OUT2 of the corresponding sensing unit 13 through a respective first line 151. The drain electrodes D1 of a part of the control units T1 are connected to the same second line 152. The gate electrodes G1 of a part of the control units T1 connected to the same second line 152 are turned on in a time division mode. The vertical projections of the blocky structures 12 on the plane where the flexible substrate is located overlap with the second lines 152 and/or the first lines 151.

As shown in FIG. 9, the sensing unit 13 may be composed of a sensing strain gauge, which may be of a rectangle, a cross shape, etc., and in an embodiment, be of a regular and symmetrical shape. In FIG. 9, only a rectangle is taken as an example, but the sensing strain gauge in the embodiment is not limited to rectangle. The sensing strain gauge includes four connecting terminals sequentially disposed on the edges of the sensing strain gauge: the first bias voltage input terminal IN1, the first strain voltage output terminal OUT1, the second bias voltage input terminal IN2 and the second strain voltage output terminal OUT2. In an embodiment, the first bias voltage input terminal IN1 and the second bias voltage input terminal IN2 may be disposed oppositely in one direction, and the first strain voltage output terminal OUT1 and the second strain voltage output terminal OUT2 may be disposed oppositely in the other direction. During the operating process of the sensor, it is necessary to input a first level to the first bias voltage input terminal IN1 and input a second level to the second bias voltage input terminal IN2. Under the driving of the pressure difference between the first level and the second level, if a deformation occurs in the position of the sensing unit 13, the first strain voltage output by the first strain voltage output terminal OUT1 is different from the second strain voltage output by the second strain voltage output terminal OUT2. Therefore, the deformation amount of the position of the sensing unit 13 may be obtained by detecting the difference between the first strain voltage and the second strain voltage.

In the embodiment, the sensor further includes multiple lines 15, and the lines 15 may include multiple first lines 151 and a multiple second lines 152. The first lines 15 may connect the control units T1 and the sensing units 13. The first lines 151 and the connecting terminals of the sensing strain gauge are disposed in one-to-one correspondence. The first bias voltage input terminal IN1 of each sensing unit 13 is connected to the first level output terminal U1 through a respective first line 151, and the second bias voltage input terminal IN2 of each sensing unit 13 is connected to the second level output terminal U2 through a respective first line 151, so that all the sensing units 13 obtain the same driving pressure difference, and the accuracy of the deformation detection of each sensing unit 13 is improved. With continued reference to FIG. 8, each control unit T1 includes the active layer (not shown in FIG. 8), the gate electrode G1 and the source electrode S1 and the drain electrode D1. The source electrode S1 of each of a part of the control units T1 is connected to the first strain voltage output terminal OUT1 of the corresponding sensing unit 13 through a respective first line 151 for detecting the first strain voltage of the corresponding sensing unit 13, and the source electrode S1 of each of the other part of the control units T1 is connected to the second strain voltage output terminal OUT2 of the corresponding sensing unit 13 through a respective first line 151 for detecting the second strain voltage of the corresponding sensing unit 13. The drain electrodes D1 of multiple the control units T1 are connected to the same second line 152, that is, the control units T1 output the first strain voltage output by multiple sensing units 13 through one second line 152, and the control units T1 output the second strain voltage output by multiple sensing units 13 through a one second line 152, to achieve saving wiring of the second lines 152. In addition, the control units T1 which are connected to the same second line 152 are turned on in the time division mode, so that the control units T1 output the first strain voltages or the second strain voltages in the time division mode. The time division mode is used in the embodiment to reduce the space layout of the wiring. In the embodiment, the second lines 152 are disposed in the peripheral region A2, the second lines 152 may be fan-out lines connected to a bound chip, so that the number of the second lines 152 is reduced, the width of the peripheral region A2 of the sensor can be effectively reduced, and the area of the sensing region A1 is increased.

It should be noted that, as shown in FIG. 8, the vertical projections of the blocky structures 12 on the plane where the flexible substrate 11 is located may overlap with the second lines 152, so that the second lines 152 are rigidly supported, the relatively dense second lines 152 are prevented from being broken, and the reliability of the sensor is further improved. Of course, the vertical projections of the blocky structures 12 on the plane where the flexible substrate 11 is located may overlap with the first lines 151, so that the first lines 151 are prevented from being broken.

Figure 10:
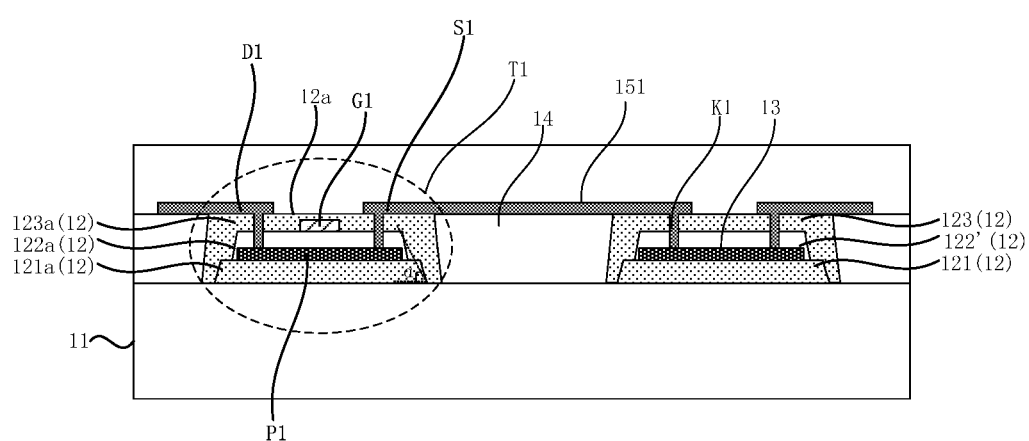
FIG. 10 is a sectional view of the sensor in FIG. 8 taken along a straight line b-b'.

FIG. 10 is a sectional view of the sensor in FIG. 8 taken along a straight line b-b'. In an embodiment, each control unit T1 may include an active layer P1, a gate electrode G1 and source and drain electrodes which are disposed sequentially away from the flexible substrate 11. The sensor further includes a first insulating layer 12a which is spaced between any two of the active layer P1, the grid electrode G1 and the source and drain electrodes, and the first insulating layer 12a is of blocky structures 12.

In the embodiment, the sensor is integrated with both the sensing units 13 and the control units T1 for performing a time division control on the sensing units 13. The control units T1 are disposed on the flexible substrate 11 and each of the control units T1 sequentially includes three film layers: the active layer P1, the gate electrode G1 and the source and drain electrodes. The active layer P1 is connected to the source electrode S1 and the drain electrode D1 respectively, and the gate electrode G1 needs to be disposed insulated from the source electrode S1 and the drain electrode D1, so that the insulating layer need to be disposed between the film layer structures in the control units T1. The sensor may include the first insulating layers 12a spaced between two adjacent film layers in the control units T1. For example, the first insulating layer 12a may be disposed between the gate electrode G1 and the source and drain electrodes. Of course, the first insulating layer 12a may further be disposed between the active layer P1 and the gate electrode G1 as a gate electrode insulating layer. The first insulating layer 12a may be made of the inorganic materials and the first insulating layer 12a may be of the blocky structures 12 to support and protect the entire control unit T1 while dispersing the bending stress. There may be one or more first insulating layers 12a. In the embodiment, at least one place exists where the first insulating layer 12a is disposed between two adjacent film layers, or the first insulating layer 12a may be disposed between every two adjacent film layers, which is not limited in the embodiment.

In an embodiment, with continued reference to FIG. 10, each control unit T1 may include a support insulating layer 121a, the active layer P1, the gate electrode insulating layer 122a, the gate electrode G1, an interlayer insulating layer 123a and the source and drain electrodes which are disposed sequentially away from the flexible substrate 11. The support insulating layer 121a, the gate electrode insulating layer 122a and the interlayer insulating layer 123a are of the blocky structures 12.

In the embodiment, the control unit T1 may include three insulating layers of the inorganic materials, as shown in FIG. 10. First, the support insulating layer 121a is disposed between the active layer P1 of the control unit T1 and the flexible substrate 11 to support the active layer P1 and prevent the active layer P1 from being broken when the sensor deforms; second, the gate electrode insulating layer 122a is disposed between the active layer P1 and the gate electrode G1, to effectively avoid the direct contact between the active layer P1 and the gate electrode G1; third, the interlayer insulating layer 123a is disposed between the gate electrode G1 and the source and drain electrodes. All the support insulating layer 121a, the gate electrode insulating layer 122a and the interlayer insulating layer 123a are of the blocky structures 12 corresponding to the sensing unit 13, and the support insulating layer 121a, the gate electrode insulating layer 122a and the interlayer insulating layer 123a are sequentially stacked in the direction away from the flexible substrate 11 to form the blocky structures 12 wrapping the control unit T1. Therefore, the control unit T1 is supported and protected and is prevented from being broken due to force.

It should be noted that in the embodiment, for the blocky structures 12 corresponding to the sensing unit 13, the first blocky structure 121 disposed on the same layer as the support insulating layer 121a, the second organic structure 122' disposed on the same layer as the gate electrode insulating layer 122a, and the third blocky structure 123 disposed on the same layer as the interlayer insulating layer 123a are also reserved to achieve the support and protection on the sensing unit 13 by the first blocky structure 121, the second blocky structure 122' and the third blocky structure 123.

With continued reference to FIG. 10, in an embodiment, a vertical projection of the support insulating layer 121a on the plane where the flexible substrate 11 is located may overlap with the gate electrode insulating layer 122a, and a vertical projection of the interlayer insulating layer 123a on the plane where the flexible substrate 11 is located overlaps with the support insulating layer 121a.

The area of the support insulating layer 121a is larger than the area of the sensing unit 13, so that the support insulating layer 121a supports the active layer P1 of the control unit T1. The gate electrode insulating layer 122a is disposed on the side of the gate electrode G1 away from the flexible substrate 11, and the area of the gate electrode insulating layer 122a is less than the area of the support insulating layer 121a, to implement the arrangement of the edges of the support insulating layer 121a and the edges of the gate electrode insulating layer 122a in the staggered mode, and cause the edges of the support insulating layer 121a and the edges of the gate electrode insulating layer 122a to form a relatively small slope angle α. Therefore, the brokenness of the edges of the inorganic film layers during the manufacturing process of the sensor caused by the excessively large slope angle α. The interlayer insulating layer 123a is disposed on the side of the gate electrode insulating layer 122a away from the flexible substrate 11, and the area of the interlayer insulating layer 123a is larger than the area of the support insulating layer 121a and the area of the gate electrode insulating layer 122a. The interlayer insulating layer 123a may wrap the support insulating layer 121a and the gate electrode insulating layer 122a, and thus the interlayer insulating layer 123a wraps the position where the support insulating layer 121a is in contact with the gate electrode insulating layer 122a. Therefore, the interlayer insulating layer 123a can protect the support insulating layer 121a and the gate electrode insulating layer 122a, enhance the strength of the support insulating layer 121a and the strength of the gate electrode insulating layer 122a, and enhance the support of the support insulating layer 121a and the gate electrode insulating layer 122a on the active layer P1.

Figure 11:
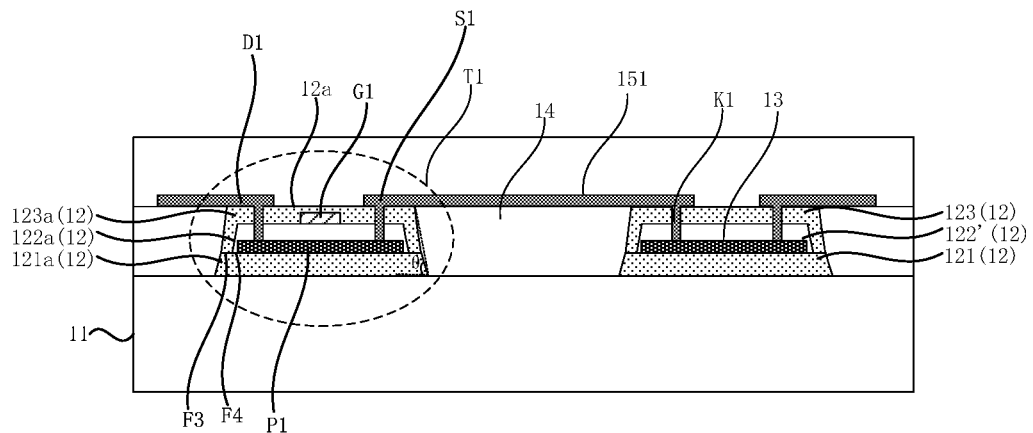
FIG. 11 is another sectional view of the sensor in FIG. 8 taken along the straight line b-b'.

FIG. 11 is another sectional view of the sensor of FIG. 8 taken along the straight line b-b'. In the embodiment, the vertical projection of the interlayer insulating layer 123a on the plane where the flexible substrate 11 is located may not overlap with the support insulating layer 121a and may further be slightly smaller than the support insulating layer 121a. As shown in FIG. 11, during forming the interlayer insulating layer 123a, the interlayer insulating layer 123a may wrap the gate electrode insulating layer 122a, but an end surface F3 of the interlayer insulating layer 123a may be in contact with a top surface F4 (i.e. the surface where the support insulating layer 121a is in contact with the active layer P1) of the support insulating layer 121a, so that the edges of the support insulating layer 121a and the edges of the interlayer insulating layer 123a can form a gentle slope angle θ. Thus, the brokenness of the edges of the support insulating layer 121a and the interlayer insulating layer 123a during the manufacturing and operating process is effectively avoided.

With continued reference to FIG. 10, in an embodiment, the sensing units 13 and the active layers P1 of the control units may be disposed on a same layer, and the first lines 151 and the source and drain electrodes of the control units are disposed on a same layer. Each first line 151 is electrically connected to a respective sensing unit 13 through a first through hole K1 passing through the interlayer insulating layer 123a and the gate electrode insulating layer 122a.

The sensing strain gauges of the sensing units 13 may be made of semiconductor materials such as polysilicon or metal materials. In the sensor integrated with both the sensing units 13 and the control units T1, when the sensing strain gauges are made of the semiconductor materials, the sensing units 13 and the active layers P1 of the control units are disposed on a same layer by adopting the same material, so that the manufacturing process is saved. The first lines 151 and the source and drain electrodes of the control units may be disposed on a same layer, so that the resistance of the first lines 151 is small, and the accuracy of the pressure detection of the sensor is improved. Thus, the first lines 151 need to pass through the interlayer insulating layers 123a and the gate electrode insulating layers 122a to be connected to the sensing units 13, and specifically may be electrically connected to the sensing units 13 through the first through holes K1 passing through the interlayer insulating layers 123*a* and the gate electrode insulating layers 122*a*.

Figure 12:
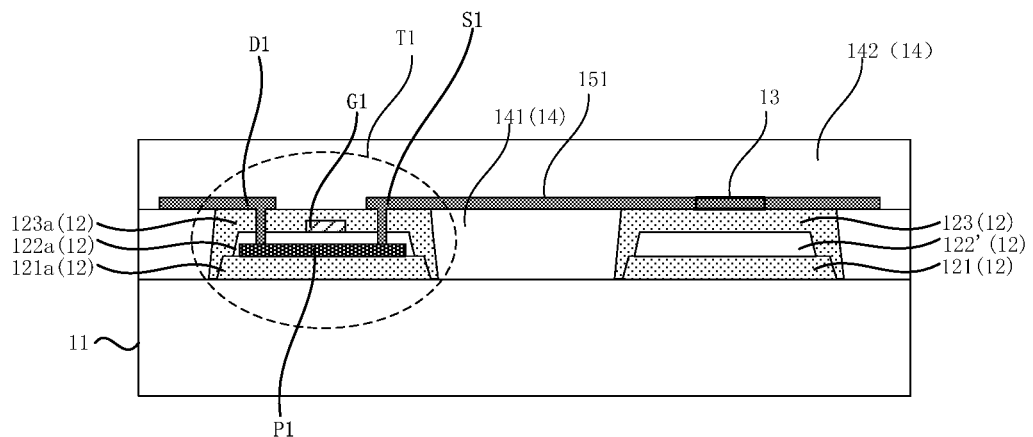
FIG. 12 is another sectional view of the sensor in FIG. 8 taken along the straight line b-b'.

FIG. 12 is another sectional view of the sensor in FIG. 8 taken along the straight line b-b'. In an embodiment, the sensing units 13 and the first lines 151 may both be disposed on a same layer as the source and drain electrodes of the control units.

As can be known from the above examples, the sensing strain gauges of the sensing units 13 may be made of metal materials, so that the sensing units 13 and the source and drain electrodes of the control units may be disposed on a same layer. As shown in FIG. 12, the first lines 151 and the source and drain electrodes of the control units may further be disposed on a same layer, so that the sensing units 13 and the first lines 151 are disposed on a same layer. The sensing units 13, the first lines 151 and the source and drain electrodes of the control units are manufactured through a same process, so that the process cost is saved, and the manufacturing process of the sensors is accelerated.

Figure 13:
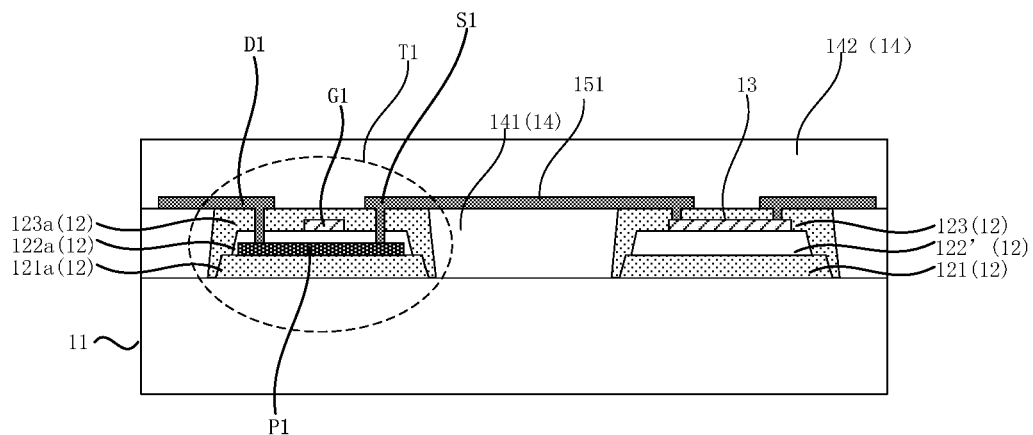
FIG. 13 is another sectional view of the sensor in FIG. 8 taken along the straight line b-b'.

FIG. 13 is another sectional view of the sensor in FIG. 8 taken along the straight line b-b'. In an embodiment, the sensing units and the gate electrodes G1 of the control units may be disposed on a same layer, the first lines 151 and the source and drain electrodes of the control units are disposed on a same layer, and each first line 131 is electrically connected to a respective sensing unit 12 through a second through hole K2 passing through the interlayer insulating layer 123*a*.

In the case where the sensing strain gauges of the sensing units 13 are made of metal materials, the sensing units 13 and the gate electrodes G1 of the control units may further be disposed on a same layer to save the manufacturing process, the first lines 151 and the source and drain electrodes of the control units may be disposed on a same layer to reduce the impedance value of the first lines 151, and the first lines 151 are electrically connected to the sensing units 13 through the second through holes K2 passing through the interlayer insulating layers 123*a*.

With continued reference to FIG. 13, in an embodiment, the second lines (not shown in FIG. 3) and the gate electrodes G1 of the control units may be disposed on a same layer; or the second lines and the source and drain electrodes of the control units are disposed on a same layer. The second lines are configured to input the first bias voltages and the second bias voltages to the sensing units and can output the first strain voltages and the second strain voltages to the bound chip for pressure detection. The second lines and the gate electrodes G1 of the control units may be disposed on a same layer or the second lines and the source and drain electrodes of the control units are disposed on a same layer, to save the manufacturing process and improve the manufacturing efficiency of the sensor.

With continued reference to FIG. 13 and FIG. 2, in an embodiment, the sensor may further include a first planarization layer 141 and a second planarization layer 142. The first planarization layer 141 is disposed between the interlayer insulating layers 123*a* and the source and drain electrodes to fill gaps between blocky structures, and the second planarization layer is disposed on the side of the source and drain electrodes away from the flexible substrate 11.

The planarization layer 14 is made of the organic material and may include the first planarization layer 141 and the second planarization layer 142. The first planarization layer 141 may be disposed between the interlayer insulating layers 123*a* and the source and drain electrodes, and when the interlayer insulating layers 123*a* being of the blocky structure is etched, a planarization layer is formed on the interlayer insulating layers 123*a*. After the polishing and other processes are performed on the planarization layer, an upper surface of the interlayer insulating layers 123*a* away from the flexible substrate 11 is exposed, and finally the first planarization layer 141 is formed, so that the formed source and drain electrodes can be conveniently in contact with the upper surface of the interlayer insulating layers 123*a* away from the flexible substrate 11. As shown in FIG. 13, the finally formed first planarization layer 141 fills the gaps between the blocky structures 12. The first planarization layer 141 made of the organic material has good flexibility to effectively disperse the stress released by the blocky structures 12. Then, the entire second planarization layer 142 is formed on the side of the source and drain electrodes away from the flexible substrate 11 to protect the control units T1 and the sensing units 13, and the bending stress of the sensor is further released in the entire plane parallel to the plane where the flexible substrate 11 is located, so that it is avoided that the sensor loses efficacy.

Figure 14:
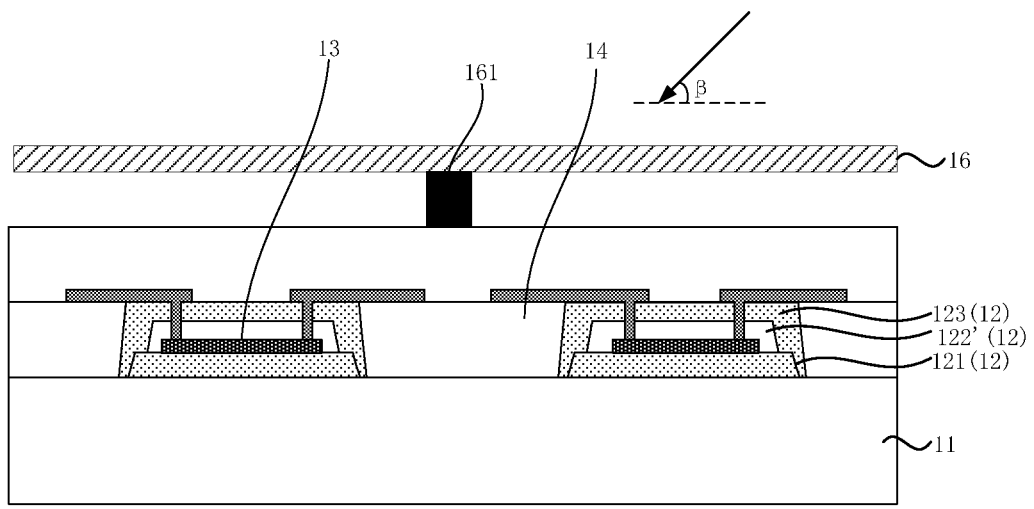
FIG. 14 is a sectional structural view of another sensor according to an embodiment of the present disclosure.

FIG. 14 is a sectional structural view of another sensor according to an embodiment of the present disclosure. In an embodiment, the sensor may further include a first bearing base plate 16, which is disposed on the side of the sensing units 13 away from the flexible substrate 11. The side of the first bearing base plate 16 close to the sensing units 13 is provided with at least one protrusion structure 161, and a vertical projection of the protrusion structure 161 on the plane where the flexible substrate 11 is located does not overlap with the sensing units 13.

The first bearing base plate 16 and the flexible substrate 11 are disposed opposite to each other and are spaced by the sensing units 13. The side of the first bearing base plate 16 close to the sensing units 13 is provided with at least one protrusion structure 161 serving as the sensor pressure head. The side of the first bearing base plate 16 away from the protrusion structure 161 is a pressing surface. When a user presses the first bearing base plate 16, the protrusion structure 161 can apply force to the flexible substrate 11, and then the flexible substrate 11 drives the sensing units 13 attached to the flexible substrate 11 to deform or move, so that the sensing units 13 can characterize the deformation by outputting the strain voltages. In the plane parallel to the plane where the flexible substrate 11 is located, multiple sensing units 13 are disposed around the protrusion structure 161. Exemplary, as shown in FIG. 1, the multiple sensing units 13 may be evenly arranged around the protrusion structure 161, and the vertical projection of the protrusion structure 161 on the plane where the flexible substrate 11 is located does not overlap with the sensing units 13. The protrusion structure 161 enables the pressure to be embodied in a concentrate mode on the pressing surface of the sensor, to conducive to obtaining the deformation of a certain position. Therefore, the sensing units 13 can output the strain voltages with strong signals, and the accuracy of the pressure measurement is improved. When the sensor is not in contact with an object, the protrusion structure 161 is not in contact with the flexible substrate 11; or the protrusion structure 161 is exactly in contact with the flexible substrate 11, but the strain of the flexible substrate 11 does not produce, that is, the sensing units 13 do not output the strain voltages at this time.

There may be one protrusion structure 161, or as shown in FIG. 14, there may be multiple protrusion structures 161. In the case where there are multiple protrusion structures 161, each protrusion structure 161 is surrounded by multiple corresponding sensing units 13. When the sensor is in contact with an object, the protrusion structures 161 are in contact with the flexible substrate 11 and cause the flexible substrate 11 to produce strain. The strain of the flexible substrate 11 causes the sensing units 13 to respond, that is, the sensing units 13 output the strain voltages to the bound chip, and the subsequent processor determines the magnitude of the pressure between the sensor and the object. The protrusion structure 161 can not only sense the magnitude of the force, but also determine the direction of the force. For example, when the direction of the force applied to the surface of the sensor is not perpendicular to the flexible substrate 11 but has a certain included angle β with the flexible substrate 11, and the flexible substrate 11 deforms caused by the contact of the protrusion structure 161 and the flexible substrate 11, the deformation amount of different positions of the protrusion structure 161 is different. Thus, the strain voltages output by the sensing units 13 around the protrusion structure 161 are different, and the direction of the pressure can be determined. In the embodiment, the protrusion structure 161 can not only be used for determining the magnitude of the pressure when the object is in contact with the sensor, but also accurately determining the direction of the pressure, so that the accuracy of force detection is further improved.

Figure 15:
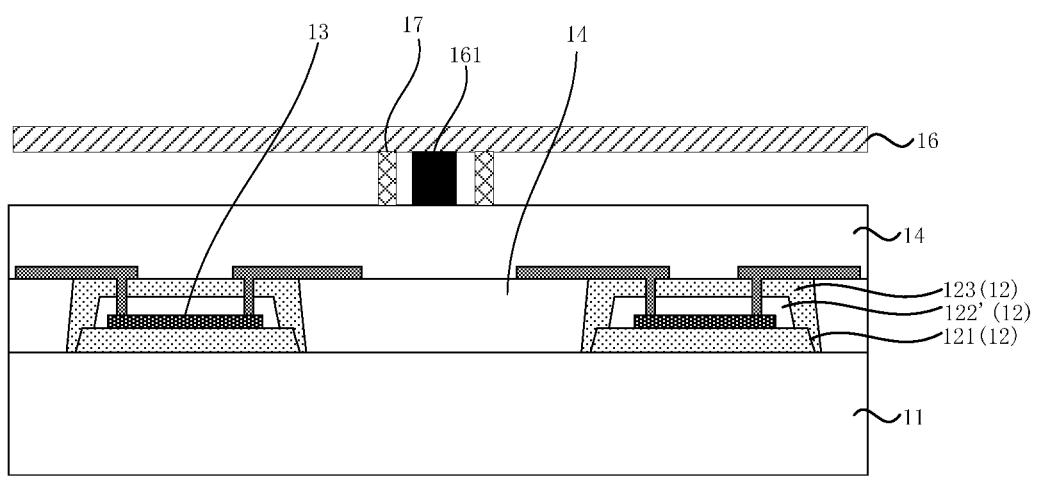
FIG. 15 is a sectional structural view of another sensor according to an embodiment of the present disclosure.
Figure 16:
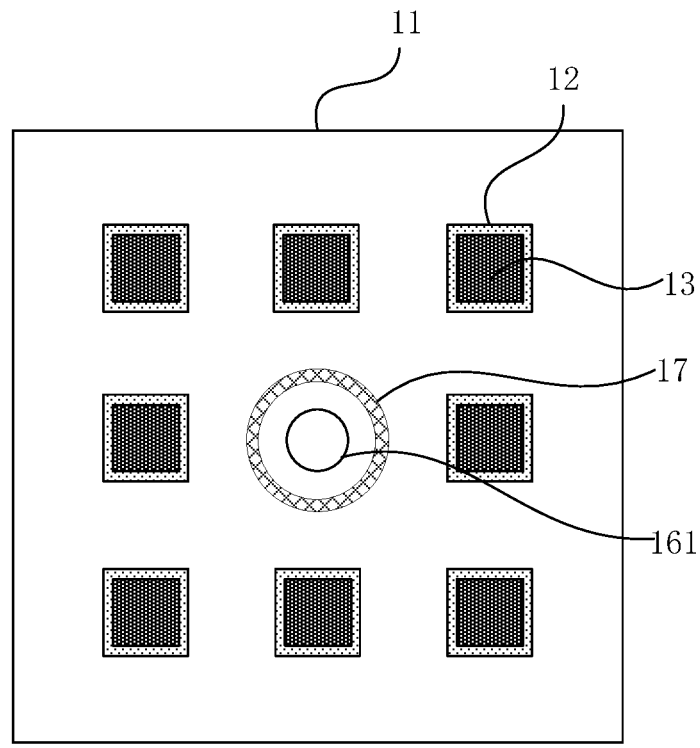
FIG. 16 is a plan structural view of another sensor according to an embodiment of the present disclosure.

FIG. 15 is a sectional structural view of another sensor according to an embodiment of the present disclosure, and FIG. 16 is a plan structural view of another sensor according to an embodiment of the present disclosure. In an embodiment, the sensor may further include a shielding structure 17, which is disposed at least partially around the protrusion structure 161, and a vertical projection of the shielding structure 17 on the plane where the flexible substrate 11 is located is between the vertical projections of the sensing units 13 on the plane where the flexible substrate 11 is located and the vertical projection of the protrusion structure 161 on the plane where the flexible substrate 11 is located.

It is found that a part of the interference signals comes from the object in contact with the pressing surface, such as a human finger. The protrusion structure 161 is generally made of a silicon-based material (not limited to this material) and is made by a micro-electro-mechanical system (MEMS) manufacturing process (not limited to this process), so that when the human finger touches the strain sensor, the static electricity of the human body causes electrostatic interference to the sensing units 13 as the protrusion structure 161 is in contact with the flexible substrate 11. Therefore, further, as shown in FIG. 16, the shielding structure 17 is disposed between the protrusion structure 161 and the sensing units 13 on the plane where the flexible substrate 11 is located in the embodiment. In order to clearly illustrate the relative positional relationship between the shielding structure 17, the protrusion structure 161 and the sensing units 13, the first bearing base plate 16 is not shown in the top structural view of the sensor. The shielding structure 17 shields the signal interference from the external signal to the sensing units 13, so that when the sensor is in contact with an object, the static electricity on the object is prevented from being induced to the sensing units 13 through the protrusion structure 161, it is avoided that the sensing units 13 respond to the static electricity to affect the detection accuracy, and the detection performance of the sensor is improved.

Figure 17:
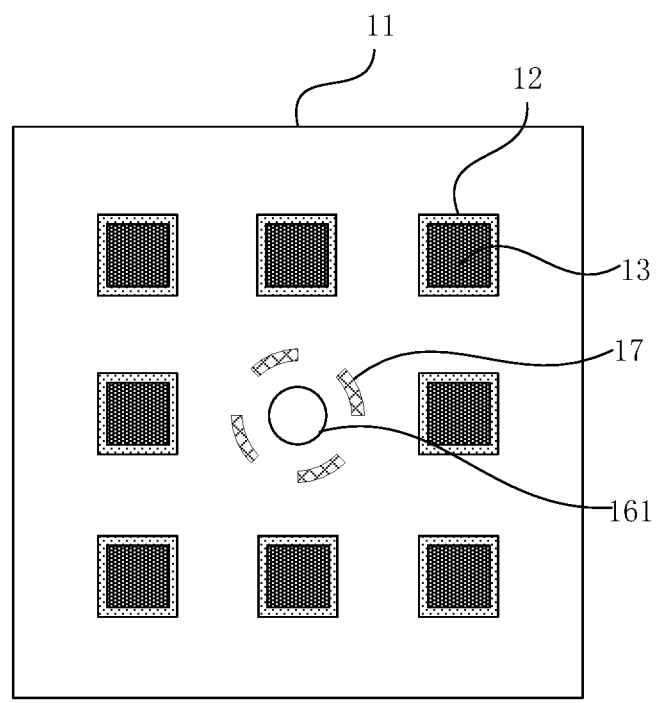
FIG. 17 is a plan structural view of another sensor according to an embodiment of the present disclosure.

FIG. 17 is a plan structural view of another sensor according to an embodiment of the present disclosure. The shielding structure 17 may, as shown in FIG. 16, be formed in a ring shape around the shielding structure 17, or as shown in FIG. 17, multiple shielding structures 17 being of the blocky structures may be disposed around the protrusion structure 161, which is not specifically limited in the embodiment.

With continued reference to FIG. 16, in an embodiment, in the plane parallel to the plane where the flexible substrate 11 is located, the shielding structure 17 may overlap with the organic layer 14 at the gaps between the blocky structures 12. In the plane parallel to the plane where the flexible substrate 11 is located, the shielding structure 17 does not overlap with the blocky structures 12, but overlaps with the organic layer 14 at the gaps between the blocky structures 12, so that the sensor can be supported to a certain extent, and the organic layer 14 at the gaps between the blocky structures 12 is prevented from being wrinkled or the film layers are prevented from being peeling off when the flexible substrate 11 is bent.

Figure 18:
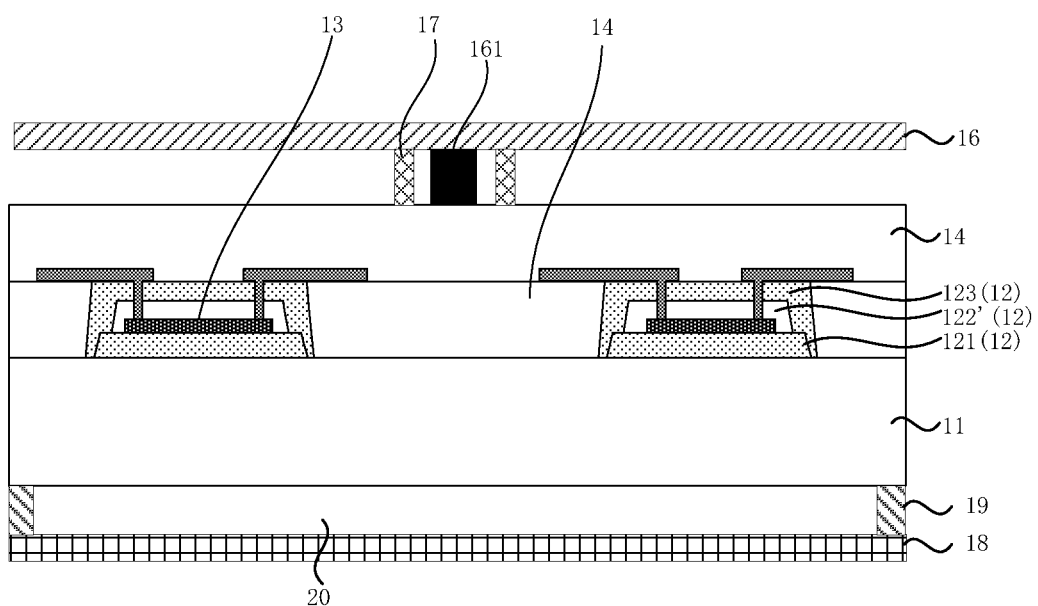
FIG. 18 is a sectional structural view of another sensor according to an embodiment of the present disclosure.

FIG. 18 is a sectional structural view of another sensor according to an embodiment of the present disclosure. In an embodiment, the sensor may further include a second bearing base plate 18 and a support portion 19. The bearing base plate 18 is disposed on the side of the flexible substrate 11 away from the sensing units 13. The support portion is disposed between the second bearing base plate 18 and the flexible substrate 11, where the second bearing base plate 18 and the support portion 19 form a cavity structure 20, and the vertical projections of the sensing units on the plane where the flexible substrate 11 is located are located in the cavity structure 20.

The support portion 19 and the second bearing base plate 18 may be independent structures, or the second bearing base plate 18 and the support portion 19 may be an integrated structure. The second bearing base plate 18 and the support portion 19 form the cavity structure 20, the flexible substrate 11 is disposed on the cavity structure 20, and the vertical projections of the sensing units 13 on the plane where the flexible substrate 11 is located are located in the vertical projection of the cavity structure 20 on the plane where the flexible substrate 11 is located. In an embodiment, the projection of the protrusion structure 161 on the plane where the flexible substrate 11 is located is also located in the vertical projection of the cavity structure 20 on the plane where the flexible substrate 11 is located, that is, the position of the flexible substrate 11 corresponding to the protrusion structure 161 and the sensing units 13 is suspended, so that a deformation space may be provided for pressing and the detection sensitivity and accuracy is improved. Although the pressing deformation is easier to conduct the static electricity, the shielding structure 17 in the present disclosure can shield the effect of static electricity on the sensing units 13. In addition, through the second bearing base plate 18, the support portion 19 and the cavity structure 20, it is avoided that the flexible substrate 11 is damaged due to the excessive deformation, and the reliability of the sensor is improved.

Figure 19:
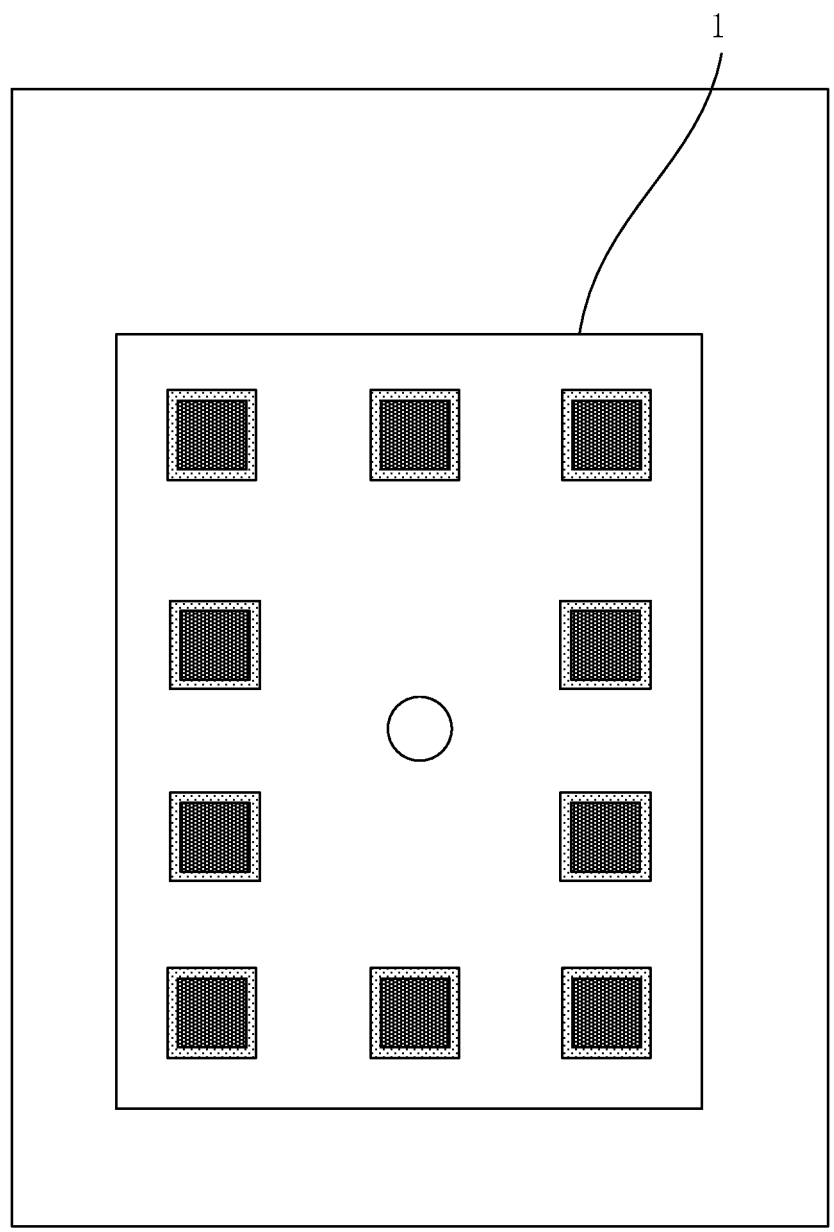
FIG. 19 is a plan structural view of a display panel according to an embodiment of the present disclosure.

Based on the same concept, an embodiment of the present disclosure further provides a display panel as shown in FIG. 19. FIG. 9 is a plan structural view of a display panel according to an embodiment of the present disclosure, and the display panel includes the sensor 1 provided by any one of the embodiments of the present disclosure. The display panel provided by the embodiment of the present disclosure may be an organic light-emitting display panel, a liquid crystal display panel, etc. The specific type of the display panel is not limited in the embodiment. The display panel in the embodiment of the present disclosure includes the features of the sensor provided by any one of the embodiments of the present disclosure, and has the effects of the sensor provided by any one of the embodiments of the present disclosure, which will not be repeated in the embodiment.

Figure 20:
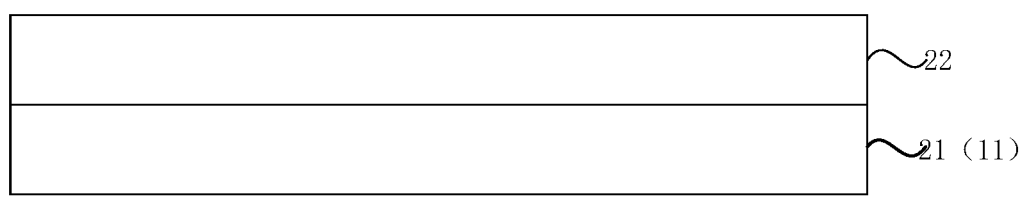
FIG. 20 is a sectional structural view of a display panel according to an embodiment of the present disclosure.
Figure 21:
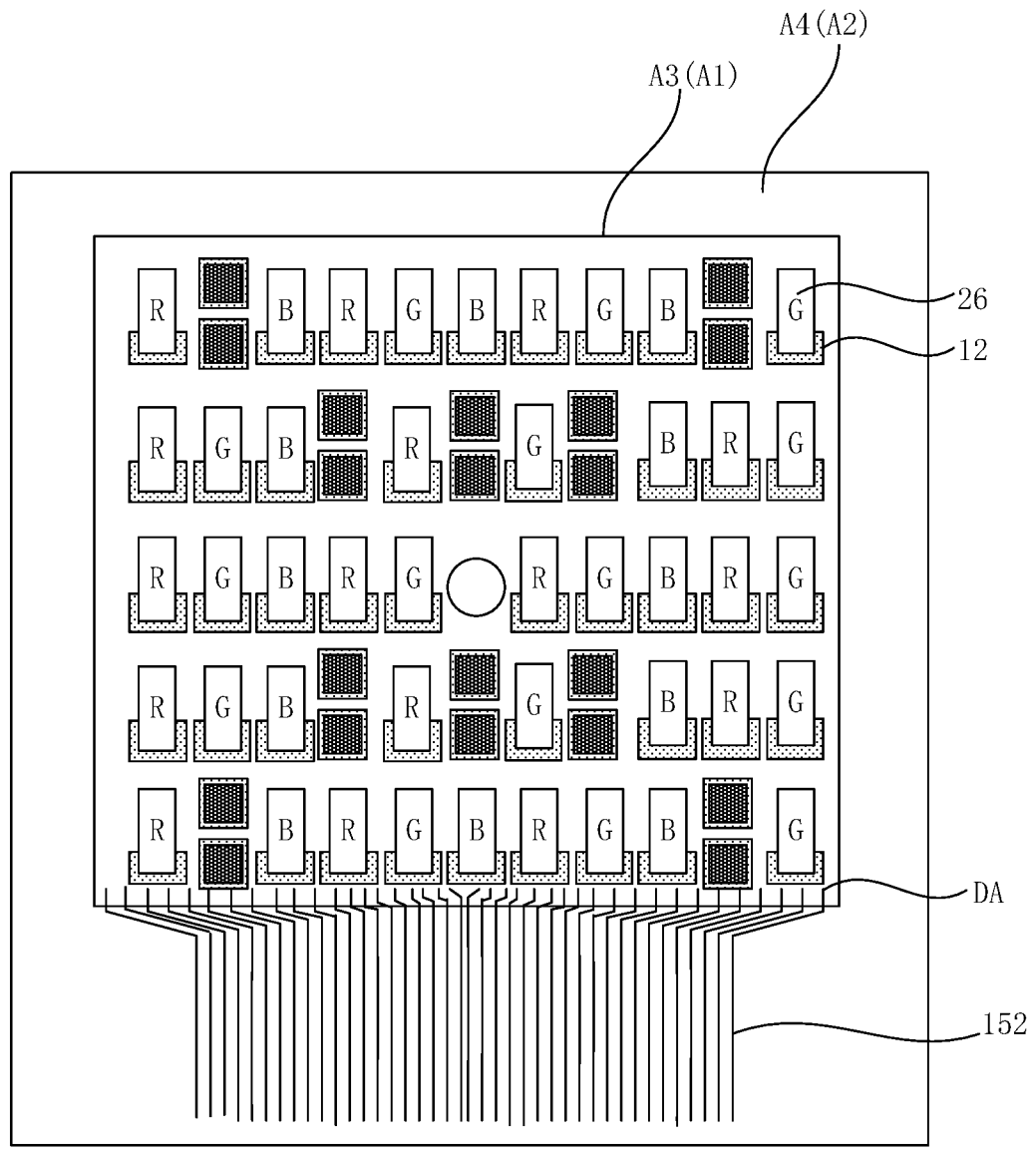
FIG. 21 is a plan structural view of another display panel according to an embodiment of the present disclosure.

On the basis of the above embodiments, as shown in FIG. 21, FIG. 20 is a sectional structural view of a display panel according to an embodiment of the present disclosure. The display panel may include a substrate 21 and a driving circuit layer 22 disposed on a side of the substrate 21, where the substrate 21 is multiplexed as the flexible substrate 11 of the sensor, and the sensing units, at least one inorganic blocky structure and at least one organic layer of the sensor are disposed on the driving circuit layer 22. In the case where the sensor is integrated on the display panel, the flexible substrate 11 and the substrate 21 of the sensor are of the same structure, so that the structure is simple and the manufacturing cost is saved. The structures in the sensing units and the driving circuit layer 22 inside the organic light-emitting display panel may be disposed on a same layer, further saving the manufacturing process of the display panel. Of course, the sensing units may also be disposed separately, for example, the sensing units may be disposed on the side of the substrate 21 facing away from the driving circuit layer 22, which is not limited in the embodiment.

Figure 22:
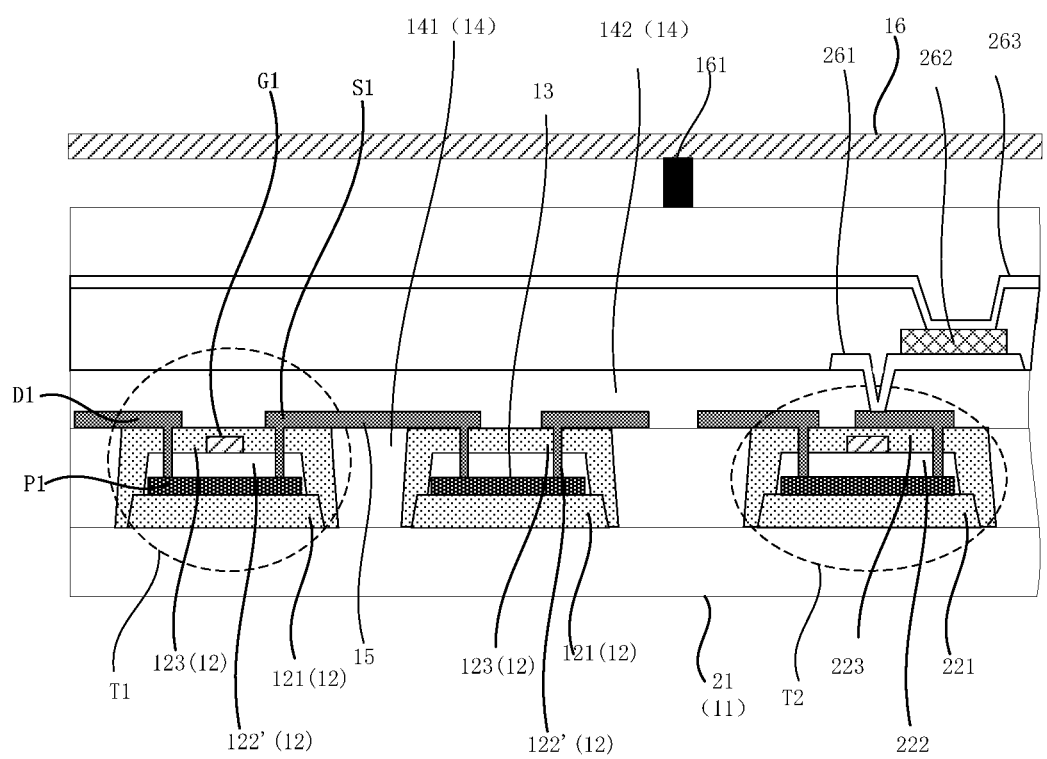
FIG. 22 is a sectional structural view of another display panel according to an embodiment of the present disclosure.

FIG. 21 is a plan structural view of another display panel according to an embodiment of the present disclosure, and FIG. 22 is a sectional structural view of another display panel according to an embodiment of the present disclosure. In an embodiment, the sensor may include multiple control units T1 and multiple lines 15, and the control units T1 are connected to the sensing units 13 through the lines 15. The control unit T1 includes the support insulating layer 121a, the active layer P1, the gate electrode insulating layer 122a, the gate electrode G1, the interlayer insulating layer 123a and the source and drain electrodes which are disposed sequentially away from the flexible substrate 11. The driving circuit layer includes multiple thin film transistors T2, multiple data lines (not shown in FIG. 22) and multiple scanning lines (not shown in FIG. 22). Support insulating layers 221 of the thin film transistors T2 and the support insulating layers 121a of the control units T1 are disposed on a same layer. Active layers P2 of the thin film transistors T2, the active layers P1 of the control units T1 and the sensing units 13 are disposed on a same layer. Gate electrode insulating layers 222 of the thin film transistors T2 and the gate electrode insulating layers 122a of the control units T1 are disposed on a same layer. Gate electrodes G2 of the thin film transistors T2, the gate electrodes G1 of the control units T1 and the scanning lines are disposed on a same layer. Interlayer insulating layers 223 of the thin film transistors T2 and the interlayer insulating layers 123a of the control units T1 are disposed on a same layer. Source and drain electrodes of the thin film transistors, the source and drain electrodes of the control units T1, the lines 15 and the data lines are disposed on a same layer. The support insulating layers 221, the gate electrode insulating layers 222 and the interlayer insulating layers 223 are blocky structures 12. The vertical projections of the blocky structures 12 on the plane where the flexible substrate 11 is located overlap with the thin film transistors T2, the control units T1 and/or the lines 15.

In the embodiment, the sensor is integrated on the display panel. Referring to FIG. 8, the sensor may include multiple control units T1 and multiple lines 15, the control units T1 are connected to the sensing units 13 through the lines 15. In addition, referring to FIG. 10, the control unit T1 includes the support insulating layer 121a, the active layer P1, the gate electrode insulating layer 122a, the gate electrode G1, the interlayer insulating layer 123a and the source and drain electrodes (i.e. the source electrode S1 and the drain electrode D1) which are disposed sequentially away from the flexible substrate 11. Specific features and connection relations are described with reference to the texts corresponding FIGS. 8 and 10, which will not be repeated here. In the embodiment, the control units T1 and the multiple lines 15 are both disposed on the driving circuit layer, the driving circuit layer includes multiple thin film transistors T2 disposed in arrays, and the thin film transistor T2 includes the support insulating layer 221, the active layer P2, the gate electrode insulating layer 222, the gate electrode G2 the interlayer insulating layer 223 and the source and drain electrodes (i.e. the source electrode S1 and the drain electrode D1) which are sequentially disposed away from the substrate 21. The support insulating layers 121a of the control units T1 and the active layers P2 of the thin film transistors T2 are disposed on a same layer. The active layers P1 of the control units T1 and the support insulating layers 221 of the thin film transistors T2 are disposed on a same layer. The gate electrode insulating layers 122a of the control units T1 and the gate electrode insulating layers 222 of the thin film transistors T2 are disposed on a same layer. The gate electrodes G1 of the control units T1 and the gate electrodes G2 of the thin film transistors T2 are disposed on a same layer. The interlayer insulating layers 123a of the control units T1 and the interlayer insulating layers 223 of the thin film transistors T2 are disposed on a same layer. The source and drain electrodes of the control units T1 and the source and drain electrodes of the thin film transistors T2 are disposed on a same layer. Therefore, redundant procedures are not required to be added to integrate the sensor on the display panel, and it is only need to set the sensing units 13 at the expense of the resolution of several pixel units 26. It should be noted that the support insulating layers 221, the gate electrode insulating layers 222 and the interlayer insulating layers 223 of the thin film transistors T2 are of blocky structures 12, so that the thin film transistors T2 corresponding to the pixel units 26 are supported and the thin film transistors T2 are prevented from being damaged due to the substrate 21 which is too soft. Similarly, the control units T1 and/or the lines 15 are correspondingly provided with the blocky structures 12 for protecting the control units T1 and/or the lines 15.

In an embodiment, the display panel is further provided with the planarization layer 14, which includes the first planarization layer 141 and the second planarization layer 142, and the first planarization layer 141 and the second planarization layer 142 are made of organic materials. Gaps between the blocky structures 12 of the control units T1 and the blocky structures 12 of the sensing unit 13, gaps between the blocky structures 12 of the sensing units 13 and the blocky structures 12 of the thin film transistors T2, and gaps between the blocky structures 12 of the control units T1 and the blocky structures 12 of the thin film transistors T2 are filled with the first planarization layer 141. The first planarization layer 141 of the organic material has relatively good flexibility and is used for dispersing the stress between the blocky structures 12. The entire layer of the second planarization layer 142 is disposed on the layer of the source and drain electrodes, so that the bending stress of the sensor is further released in the entire plane of the sensor parallel to the plane where the flexible substrate 11 is located, and it is avoided that the sensor loses efficacy. It should be noted that in FIG. 22, the organic light-emitting display panel is taken as an example for the comparison between the film layers, and a first electrode 261, an organic light-emitting layer 262 and a second electrode 263 of the pixel unit 26 are sequentially formed on the second planarization layer 142. However, the embodiment is not limited to the above organic light-emitting display panel, and the display panel may further be a liquid crystal panel or the like. In addition, the sensor further includes the first bearing base plate 16. At least one protrusion structure 161 is disposed on the side of the first bearing base plate 16 of the pixel unit close to the sensing units 13. When a touch body (e.g., a finger) touches the display panel, the protrusion structure 161 inside the sensor is in contact with the display panel, which causes the flexible substrate 11 to produce strain, the strain of the flexible substrate 11 causes the sensing units 13 to respond, that is, the sensing units 13 output the strain voltages to a driver chip, and the driver chip determines the magnitude and direction of the pressure and the position of the touch based on the strain voltages.

In an embodiment, with continued reference to FIG. 8 and FIG. 21, the sensor may include the sensing region A1 and the peripheral region A2, the sensing region A1 and the display region A3 of the display panel completely coincide, the control units T1 are disposed in the peripheral region A2, and the sensing units 13 are disposed in the sensing region A2. That is, the control units T1 are disposed in a non-display region A4 together with a demux circuit, an electrostatic protection circuit and the like of the display panel, by way of example, may be disposed in a lower step region. The sensing units 13 are disposed in the display region A3. Therefore, the display panel can not only display images, but also detect the stress on the display panel, which is beneficial to improving the preset function of the display panel. For example, different display functions can be triggered through different stress or different directions of the stress. For example, when the display panel detects that the stress is greater than a set threshold, a black-screen function of the display panel can be triggered to prevent other people from peeping. Thus, special functions of the display panel can be developed and expanded.

In an embodiment, with continued reference to FIG. 8 and FIG. 21, the lines 15 may include the first lines 151 and the second lines 152, and the second lines 152 are disposed in the peripheral region A2. The control units T1 are connected to the sensing units 13 through the first lines 151, and each control unit T1 is connected to multiple second lines 152. The second lines 152 and the data lines are disposed on a same layer and are parallel to the data lines. The control units T1 and the second lines 152 are disposed in the non-display region A4 of the display panel and are disposed in the lower step region of the display panel together with fan-out lines of the display panel, and the second lines 152 and the data lines DA are disposed on a same layer and parallel to the data lines DA, which is conducive to the integration of the display panel and the sensor. Thus, the structure is simple, and other procedures do not need to be added.

Figure 23:
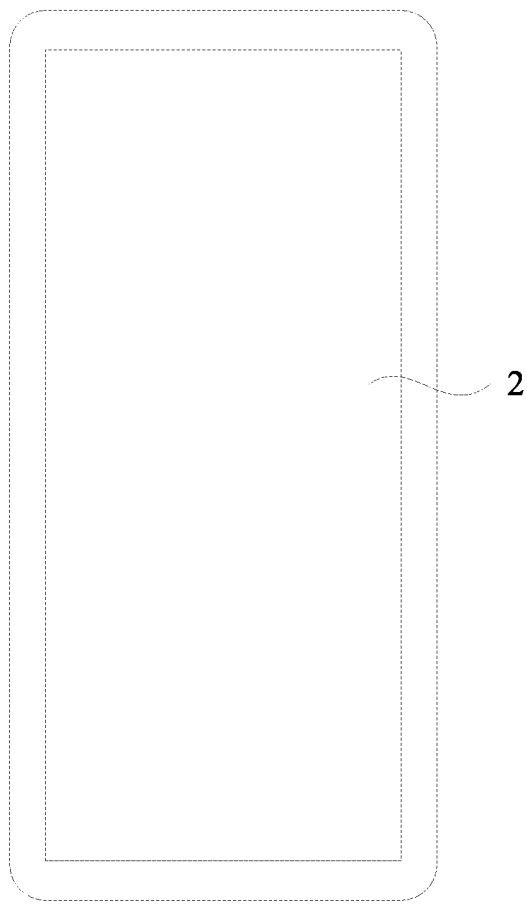
FIG. 23 is a structural view of an electronic device according to an embodiment of the present disclosure.

An embodiment of the present disclosure further provides an electronic device. FIG. 23 is a structural view of an electronic device according to an embodiment of the present disclosure. As shown in FIG. 23, the electronic device may include the display panel provided by any one of the embodiments of the present disclosure. The electronic device provided by the embodiment of the present disclosure includes the organic light-emitting panel 2 in any one of the embodiments of the present disclosure. The electronic device may be a mobile phone as shown in FIG. 23, or may be a computer, a television, a vehicle-mounted display screen, a smart wearable device (particularly a flexible wearable device), etc., which is not particularly limited in the embodiment.

Figure 24:
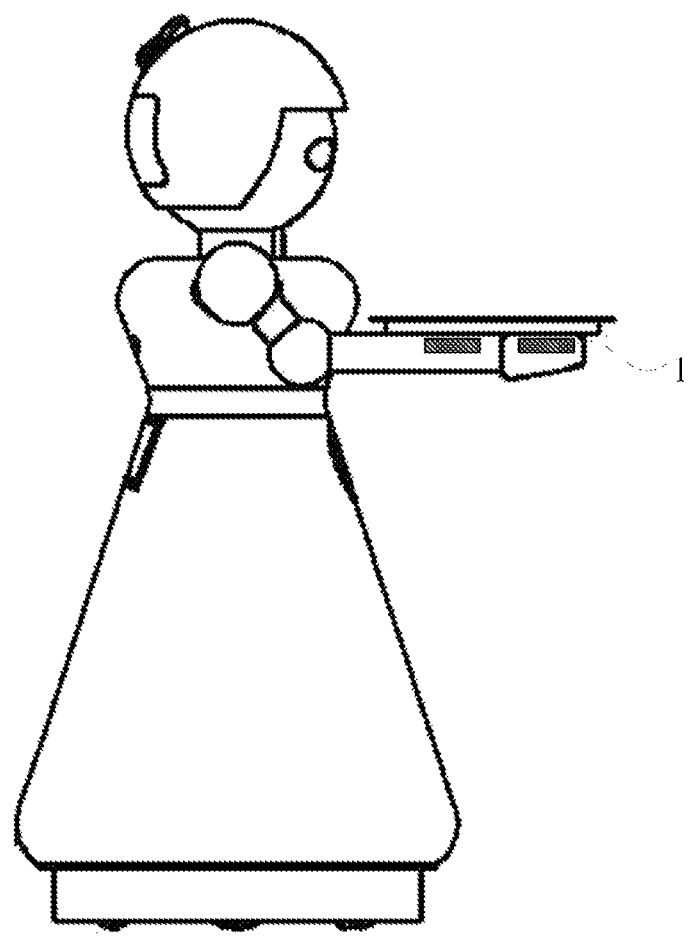
FIG. 24 is a structural view of another electronic device according to an embodiment of the present disclosure.

FIG. 24 is a structural view of another electronic device according to an embodiment of the present disclosure. As shown in FIG. 24, the electronic device may include the sensor 1 provided by any one of the embodiments of the present disclosure. The sensor 1 may be integrated on the body surface of the electronic device to sense the external pressure. For example, as a robot device shown in FIG. 24, the sensor is disposed on the body surface of the robot. Exemplary, the sensor 1 may be disposed on an arm, a palm or a finger end of the robot. If the robot is a dining robot or a material conveying robot, the weight of an object can be determined through the pressure on the palm of the robot, and the type of the object can be determined according to the weight, so that the automation process of the service industry and the industry can be improved.

What is claimed is:

1. A sensor, comprising:
a flexible substrate;
a plurality of sensing units disposed on a first side of the flexible substrate; and
at least one inorganic blocky structure and at least one organic layer which are disposed on the first side of the flexible substrate;
wherein each of the plurality of sensing units is disposed corresponding to a respective one of the at least one blocky structure, and a vertical projection of at least part of the respective one of the at least one blocky structure on a plane where the flexible substrate is located overlaps with the corresponding one of the plurality of sensing units; and
wherein the at least one organic layer is filled adjacent blocky structures.

2. The sensor according to claim 1, further comprising:
at least one inorganic layer; wherein
each of the at least one inorganic layer comprises a plurality of blocky structures; and
the plurality of blocky structures are disposed in one-to-one correspondence with the plurality of sensing units.

3. The sensor according to claim 2, wherein at least one organic layer is disposed between adjacent blocky structures which are located in different inorganic layers.

4. The sensor according to claim 3, wherein the at least one organic layer is encapsulated by the adjacent blocky structures disposed on two sides of the at least one organic layer.

5. The sensor according to claim 1, further comprising:
a plurality of lines and a plurality of control units electrically connected to the plurality of sensing units;
a sensing region and a peripheral region surrounding the sensing region; wherein the sensing region is provided with the plurality of sensing units; and the peripheral region is provided with the plurality of control units;
a vertical projection of the at least one blocky structure on the plane where the flexible substrate is located overlaps with the plurality of control units; and/or, a vertical projection of the at least one blocky structure on the plane where the flexible substrate is located overlaps with the plurality of lines.

6. The sensor according to claim 5, wherein the plurality of lines comprise a plurality of first lines and a plurality of second lines;
the plurality of control units are connected to the plurality of sensing units through at least part of the plurality of first lines; and the plurality of second lines are disposed in the peripheral region;
each of the plurality of sensing units comprises a sensing strain gauge;

edges of the sensing strain gauge are sequentially provided with four connecting terminals: a first bias voltage input terminal, a first strain voltage output terminal, a second bias voltage input terminal and a second strain voltage output terminal; the four connecting terminals are connected in one-to-one correspondence to four respective ones of the plurality of first lines; the first bias voltage input terminal of each of the plurality of sensing units is connected to a first level output terminal through a respective one of the plurality of first lines; and the second bias voltage input terminal of each of the plurality of sensing units is connected to a second level output terminal through a respective one of the plurality of first lines;

each of the plurality of control units comprises an active layer, a gate electrode and source and drain electrodes; the source electrode of each of a part of the plurality of control units is connected to the first strain voltage output terminal of a respective one of the plurality of sensing units through a respective one of the plurality of first lines;

the source electrode of each of the other part of the plurality of control units is connected to the second strain voltage output terminal of a respective one of the plurality of sensing units through a respective one of the plurality of first lines; drain electrodes of at least part of the plurality of control units are connected to a same second line, and gate electrodes of the at least part of the plurality of control units connected to the same second line are turned on in a time division mode; and the vertical projection of the at least one blocky structure on the plane where the flexible substrate is located overlaps with the plurality of second lines and/or the plurality of first lines.

7. The sensor according to claim 6, wherein the active layer, the gate electrode and the source and drain electrodes, comprised in each of the plurality of control units, are disposed sequentially away from the flexible substrate; and the sensor further comprises a first insulating layer which is spaced between any two of the active layer, a grid electrode and the source and drain electrodes; and the first insulating layer includes a part of the blocky structures.

8. The sensor according to claim 6, wherein each of the plurality of control units comprises a support insulating layer, the active layer, a gate electrode insulating layer, the gate electrode, an interlayer insulating layer and the source and drain electrodes which are disposed sequentially away from the flexible substrate; and the blocky structures are formed by one of the support insulating layer, the gate electrode insulating layer and the interlayer insulating layer or a combination of at least two of the support insulating layer, the gate electrode insulating layer and the interlayer insulating layer.

9. The sensor according to claim 8, wherein the plurality of sensing units and active layers are disposed on a same layer; the plurality of first lines and source and drain electrodes are disposed on a same layer; and each of the plurality of first lines is electrically connected to a respective one of the plurality of sensing units through a first through hole passing through the interlayer insulating layer and the gate electrode insulating layer; or, the plurality of sensing units and the plurality of first lines are disposed on a same layer as the source and drain electrodes; or, the plurality of sensing units and gate electrodes are disposed on a same layer; the plurality of first lines and source and drain electrodes are disposed on a same layer; and each of the plurality of first lines is electrically connected to a respective one of the plurality of sensing units through a second through hole passing through the interlayer insulating layer.

10. The sensor according to claim 8, wherein the plurality of second lines and gate electrodes are disposed on a same layer; or, the plurality of second lines and source and drain electrodes are disposed on a same layer.

11. The sensor according to claim 8, wherein a vertical projection of the support insulating layer on the plane where the flexible substrate is located overlaps with the gate electrode insulating layer; and a vertical projection of the interlayer insulating later on the plane where the flexible substrate is located overlaps with the support insulating layer.

12. The sensor according to claim 8, further comprising:
a first planarization layer and a second planarization layer;
wherein the first planarization layer is disposed between the interlayer insulating layer and the source and drain electrodes to fill a gap between blocky structures; and
the second planarization layer is disposed on a side of the source and drain electrodes away from the flexible substrate.

13. The sensor according to claim 1, further comprising:
a second organic structure, wherein each of the at least one blocky structure comprises a first blocky structure and a third blocky structure which are sequentially stacked along a direction away from the flexible substrate, and the second organic structure is between the first blocky structure and the third blocky structure;
wherein the first blocky structure is disposed on a side of each of the plurality of sensing units close to the flexible substrate, and an area of the first blocky structure is larger than an area of each of the plurality of sensing units; an area of the second organic structure is smaller than the area of the first blocky structure; and
the third blocky structure is disposed on a side of each of the plurality of sensing units away from the flexible substrate, and an area of the third blocky structure is larger than the area of the first blocky structure.

14. The sensor according to claim 1, further comprising:
a first bearing base plate, which is disposed on a side of the plurality of sensing units away from the flexible substrate;
wherein a side of the first bearing base plate close to the plurality of sensing units is provided with at least one protrusion structure; and a vertical projection of the at least one protrusion structure on the plane where the flexible substrate is located does not overlap with the plurality of sensing units.

15. The sensor according to claim 14, further comprising:
a shielding structure, which is disposed at least partially around the at least one protrusion structure, wherein a vertical projection of the shielding structure on the plane where the flexible substrate is located is between vertical projections of the plurality of sensing units on the plane where the flexible substrate is located and the vertical projection of the at least one protrusion structure on the plane where the flexible substrate is located.

16. The sensor according to claim 15, wherein in a plane parallel to the plane where the flexible substrate is located, the shielding structure overlaps with the organic layer at a gap between adjacent blocky structures.

17. The sensor according to claim 1, further comprising:
a second bearing base plate, which is disposed on a side of the flexible substrate away from the plurality of sensing units; and
a support portion, which is disposed between the second bearing base plate and the flexible substrate; wherein the second bearing base plate and the support portion form a cavity structure; and vertical projections of the plurality of sensing units on the plane where the flexible substrate is located are located in the cavity structure.

18. A display panel, comprising the sensor of claim 1.

19. The display panel according to claim 18, further comprising:
a substrate; and
a driving circuit layer disposed on a side of the substrate;
wherein the substrate is multiplexed as the flexible substrate of the sensor; and the plurality of sensing units, the at least one inorganic blocky structure and the at least one organic layer of the sensor are disposed on the driving circuit layer.

20. The display panel according to claim 19, wherein the sensor further comprises a plurality of control units and a plurality of lines; the plurality of control units are connected to the plurality of sensing units through the plurality of lines;
each of the plurality of control units comprises a support insulating layer, an active layer, a gate electrode insulating layer, a gate electrode, an interlayer insulating layer and source and drain electrodes which are disposed sequentially away from the flexible substrate;
the driving circuit layer comprises a plurality of thin film transistors, a plurality of data lines and a plurality of scanning lines;
support insulating layers of the plurality of thin film transistors and support insulating layers of the plurality of control units are disposed on a same layer; active layers of the plurality of thin film transistors, active layers of the plurality of control units and the plurality of sensing units are disposed on a same layer; gate electrode insulating layers of the plurality of thin film transistors and gate electrode insulating layers of the plurality of control units are disposed on a same layer;
gate electrodes of the plurality of thin film transistors, gate electrodes of the plurality of control units and the plurality of scanning lines are disposed on a same layer;
interlayer insulating layers of the plurality of thin film transistors and interlayer insulating layers of the plurality of control units are disposed on a same layer;
source and drain electrodes of the plurality of thin film transistors, source and drain electrodes of the plurality of control units, the plurality of lines and the plurality of data lines are disposed on a same layer; and all of the support insulating layers, the gate electrode insulating layers and the interlayer insulating layers are of blocky structures; and
vertical projections of the blocky structures on the plane where the flexible substrate is located overlap with the plurality of thin film transistors, the plurality of control units and/or the plurality of lines.

21. The display panel according to claim 20, wherein the sensor further comprises a sensing region and a peripheral region; the sensing region overlaps with a display region of the display panel; the plurality of control units are disposed in the peripheral region; and the plurality of sensing units are disposed in the sensing region.

22. The display panel according to claim 21, wherein the plurality of lines comprise a plurality of first lines and a plurality of second lines; and the plurality of second lines are disposed in the peripheral region; and
the plurality of control units are connected to the plurality of sensing units through at least part of the plurality of first lines; each of the plurality of control units is connected to a part of the plurality of second lines; and the plurality of second lines and the plurality of data lines are disposed on a same layer, and the plurality of second lines are parallel to the plurality of data lines.

* * * * *